(12) United States Patent
Yang et al.

(10) Patent No.: US 11,670,737 B2
(45) Date of Patent: Jun. 6, 2023

(54) DISPLAY DEVICE

(71) Applicant: Samsung Display Co., LTD., Yongin-si (KR)

(72) Inventors: Yong Hoon Yang, Hwaseong-si (KR); Min Suk Ko, Cheonan-si (KR); Si Kwang Kim, Daegu (KR); Kab Jong Seo, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 205 days.

(21) Appl. No.: 16/916,965

(22) Filed: Jun. 30, 2020

(65) Prior Publication Data

US 2021/0057610 A1 Feb. 25, 2021

(30) Foreign Application Priority Data

Aug. 20, 2019 (KR) .................. 10-2019-0101602

(51) Int. Cl.
*H01L 33/38* (2010.01)
*H01L 27/32* (2006.01)

(52) U.S. Cl.
CPC .......... *H01L 33/38* (2013.01); *H01L 27/3218* (2013.01); *H01L 27/3246* (2013.01); *H01L 27/3276* (2013.01)

(58) Field of Classification Search
CPC . H01L 33/38; H01L 27/3218; H01L 27/3246; H01L 27/3276; H01L 33/18; H01L 33/20; H01L 33/24; H01L 33/62; H01L 25/0753; H01L 27/156; H01L 27/124; H01L 27/1248; H01L 27/1259; H01L 33/005; H01L 33/26
See application file for complete search history.

(56) References Cited

U.S. PATENT DOCUMENTS

2018/0012876 A1* 1/2018 Kim .................. H01L 33/325
2018/0019369 A1* 1/2018 Cho .................. H05K 1/11

FOREIGN PATENT DOCUMENTS

| KR | 10-1730977 | 4/2017 |
|---|---|---|
| KR | 10-1770632 | 8/2017 |

* cited by examiner

*Primary Examiner* — Su C Kim
(74) *Attorney, Agent, or Firm* — Kile Park Reed & Houtteman PLLC

(57) ABSTRACT

A display device includes a first electrode extending in a first direction, a second electrode extending in the first direction and spaced apart from the first electrode in a second direction, a first light-emitting element disposed in a first area between the first electrode and the second electrode, a second light-emitting element disposed in a second area outside of the first area, a first contact electrode disposed on the first electrode and electrically connected with a first end of the first light-emitting element, a second contact electrode disposed on the second electrode and electrically connected with a second end of the first light-emitting element and a first end of the second light-emitting element, and a third contact electrode disposed on the first electrode and electrically connected with a second end of the second light-emitting element.

23 Claims, 18 Drawing Sheets

10_7

DISPLAY DEVICE

CROSS REFERENCE TO RELATED APPLICATION(S)

This application claims priority from Korean Patent Application No. 10-2019-0101602 filed on Aug. 20, 2019 in the Korean Intellectual Property Office, and all the benefits accruing therefrom under 35 U.S.C. § 119, the entire contents of which are incorporated herein by reference.

BACKGROUND

1. Technical Field

The disclosure relates to a display device, and to a display device including contact electrodes and light-emitting elements.

2. Description of the Related Art

Display devices have become more important together with the development of multimedia. Various types of display devices have been developed such as an organic light-emitting diode (OLED) display device, a liquid crystal display (LCD) device, or the like.

In general, a display device for displaying an image includes a display panel such as an OLED display panel or an LCD panel. A light-emitting display panel may include light-emitting elements such as light-emitting diodes (LEDs). Examples of the LEDs include OLEDs using an organic material as a fluorescent material and inorganic LEDs using an inorganic material as a fluorescent material.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments include a display device which may include contact electrodes and can thus allow light-emitting elements disposed in regions other than regions between electrodes to emit light.

Embodiments also include a display device having improved emission rate of pixels or subpixels.

However, embodiments of the disclosure are not restricted to those set forth herein. The above and other embodiments will become more apparent to one of ordinary skill in the art to which the disclosure pertains by referencing the detailed description given below.

According to the aforementioned and other embodiments, a display device may include light-emitting elements disposed in regions between first and second electrodes, light-emitting elements disposed in regions other than (or outside of) the regions between the first and second electrodes, and contact electrodes in electrical contact with the light-emitting elements. Since the contact electrodes may be in electrical contact with the light-emitting elements and with the first or second electrode, even the light-emitting elements disposed in the regions outside of regions between the first and second electrodes can receive electrical signals from the first and second electrodes and thus emit light.

Therefore, the loss of light-emitting elements can be mitigated or minimized, and the emission rate, per unit area, of pixels or subpixels can be improved.

Other features and embodiments may be apparent from the following detailed description, the drawings, and the claims.

According to an embodiment, a display device may comprise a first electrode extending in a first direction, a second electrode extending in the first direction and spaced apart from the first electrode in a second direction, a first light-emitting element disposed in a first area between the first electrode and the second electrode, a second light-emitting element disposed in a second area, outside of the first area, a first contact electrode disposed on the first electrode to be and electrically connected with a first end of the first light-emitting element, a second contact electrode disposed on the second electrode and electrically connected with a second end of the first light-emitting element and a first end of the second light-emitting element, and a third contact electrode disposed on the first electrode and electrically connected with a second end of the second light-emitting element.

The first light-emitting element and the second light-emitting element may be electrically connected to the first electrode and the second electrode.

The first contact electrode and the third contact electrode may be electrically connected with the first electrode and may partially overlap the first electrode in a plan view.

The third contact electrode may be electrically connected to the first contact electrode, and be not electrically connected with the first electrode.

The display device may further include a third light-emitting element disposed in the second area and including a first end electrically connected with the first contact electrode and a fourth contact electrode disposed on the second electrode and electrically connected with a second end of the third light-emitting element.

The first contact electrode and the second contact electrode may extend in the first direction, and each of the third contact electrode and the fourth contact electrode may include a first portion that extends in the second direction.

The first light-emitting element may extend in a direction substantially parallel to the second direction.

Each of the third contact electrode and the fourth contact electrode may include a second portion that extends in the first direction.

The second light-emitting element may extend in a direction substantially parallel to the first direction, the second end of the second light-emitting element being electrically connected with the first portion of the third contact electrode, and the third light emitting element may extend in a direction substantially parallel to the second, the second end of the third light-emitting element being electrically connected with the second portion of the fourth contact electrode.

The display device may further comprise an insulating layer disposed in the first area between the first electrode and the second electrode and disposed on at least a portion of the first light-emitting element.

The insulating layer may extend in the first direction and may not be electrically connected with the second and third light-emitting elements.

According to an embodiment, a display device may include a first electrode including a first electrode stem extending in a first direction, and a first electrode branch branched off from the first electrode stem and extending in a second direction, a second electrode including a second electrode stem extending in the first direction, and a second electrode branch branched off from the second electrode stem and spaced apart from the first electrode branch, a first light-emitting element disposed between a first side of the first electrode branch and a first side of the second electrode branch, a second light-emitting element disposed on a second side of the first electrode branch, a third light-emitting element disposed on a second side of the second electrode branch, a first contact electrode disposed on the first electrode branch and electrically connected with a first end of the first light-emitting element and a first end of the second light-emitting element, a second contact electrode disposed on the second electrode branch and electrically connected with a second end of the first light-emitting element and a first end of the third light-emitting element, a third contact electrode electrically connected with a second end of the second light-emitting element, and a fourth contact electrode electrically connected with a second end of the third light-emitting element.

In an embodiment, the first, second, and third light-emitting elements may be electrically connected to the first and second electrodes.

In an embodiment, the first contact electrode may be electrically connected with the first electrode branch and may partially overlap the first electrode branch in a plan view, and the second contact electrode may be electrically connected with the second electrode branch and may partially overlap the second electrode branch in a plan view.

In an embodiment, the first and second contact electrodes may extend in the second direction and are spaced apart from each other in the first direction.

In an embodiment, each of the third and fourth contact electrodes may include a portion that extends in the first direction, the third contact electrode may be electrically connected with the second electrode branch, and the fourth contact electrode may be electrically connected with the first electrode branch.

In an embodiment, each of the third and fourth contact electrodes may include a portion that extends in the second direction, the third contact electrode may be electrically connected with the second electrode stem, and the fourth contact electrode may be electrically connected with the first electrode stem.

According to another embodiment, a display device may include a first electrode and a second electrode spaced apart from each other on a substrate, a first insulating layer disposed on the substrate and at least partially overlapping the first and second electrodes in a plan view, at least one light-emitting element disposed on the first insulating layer and electrically connected to the first electrode and the second electrode, the at least one light-emitting element including a first light-emitting element disposed in a first area between the first electrode and the second electrode, a second light-emitting element disposed in a second area outside of the first area, and at least one contact electrode electrically connected with an end of the at least one light-emitting element and at least one of the first electrode and the second electrode. The at least one contact electrode may include a first contact electrode electrically connected with a first end of the first light-emitting element and a first end of the second light-emitting element, a second contact electrode electrically connected with a second end of the first light-emitting element, and a third contact electrode electrically connected with a second end of the second light-emitting element. In an embodiment, the display device may further may include multiple banks disposed on the substrate, the multiple banks including a first bank overlapping the first electrode and the first contact electrode, a second bank overlapping the second electrode and the second contact electrode, and a third bank overlapping the third contact electrode.

In an embodiment, the display device may further include a second insulating layer disposed between the first electrode and the second electrode and overlapping at least a portion of the first light-emitting element, wherein the second insulating layer may be electrically connected with the first electrode and the second contact electrode and may partially overlap the first electrode and the second electrode in a plan view.

BRIEF DESCRIPTION OF THE DRAWINGS

The above and other embodiments and features will become more apparent by describing in detail embodiments thereof with reference to the attached drawings, in which.

DETAILED DESCRIPTION OF THE EMBODIMENTS

Figure 1:
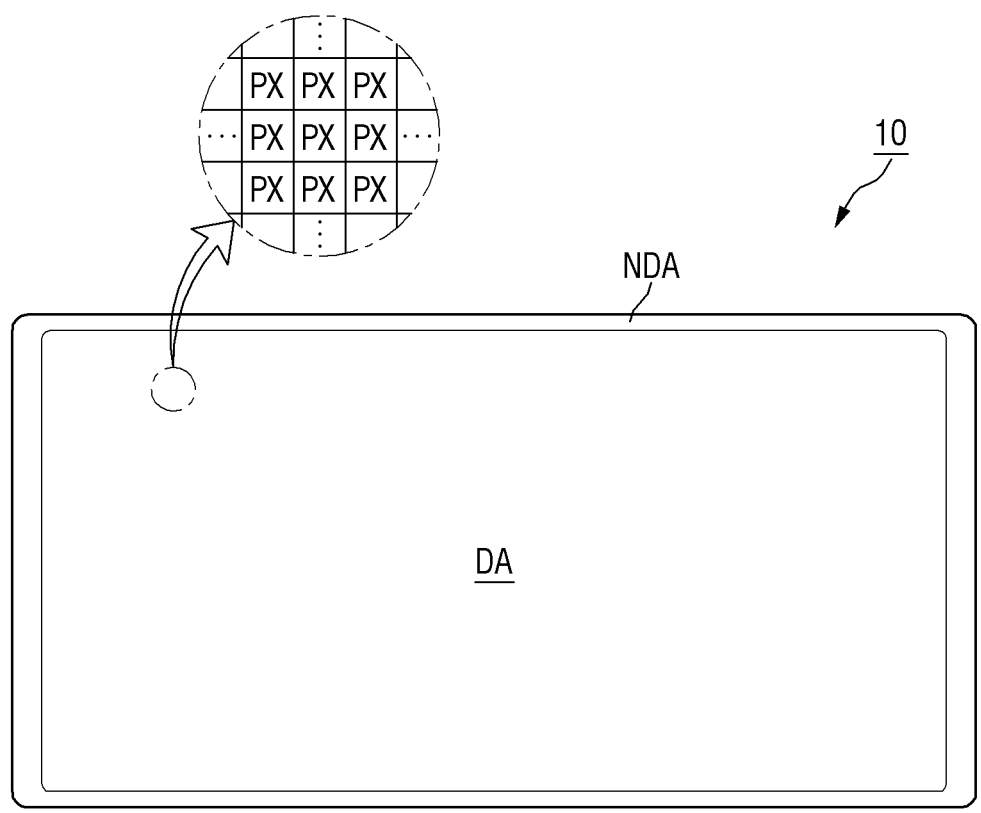
FIG. 1 is a schematic plan view of a display device according to an embodiment.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

When a layer, film, region, substrate, or area, is referred to as being "on" another layer, film, region, substrate, or area, it may be directly on the other film, region, substrate, or area, or intervening films, regions, substrates, or areas, may be present therebetween. Conversely, when a layer, film, region, substrate, or area, is referred to as being "directly on" another layer, film, region, substrate, or area, intervening layers, films, regions, substrates, or areas, may be absent therebetween. Further when a layer, film, region, substrate, or area, is referred to as being "below" another layer, film, region, substrate, or area, it may be directly below the other layer, film, region, substrate, or area, or intervening layers, films, regions, substrates, or areas, may be present therebetween. Conversely, when a layer, film, region, substrate, or area, is referred to as being "directly below" another layer, film, region, substrate, or area, intervening layers, films, regions, substrates, or areas, may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Throughout the specification, when an element is referred to as being "connected" to another element, the element may be "directly connected" to another element, or "electrically connected" to another element with one or more intervening elements interposed therebetween.

Also, when an element is referred to as being "in contact" or "contacted" or the like to another element, the element may be in "electrical contact" or in "physical contact" with another element; or in "indirect contact" or in "direct contact" with another element. It will be further understood that when the terms "comprises," "comprising," "includes" and/or "including" are used in this specification, they or it may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein. For example, a first color filter may be any one of a red, green, or blue color filter. A second color filter may be any one of a red, green, or blue color filter. A third color filter may be any one of a red, green, or blue color filter. First and second with respect to the light blocking members may be used interchangeably in the specification.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 80%, 5% of the stated value.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

In the drawings, sizes and thicknesses of elements may be enlarged for better understanding, clarity, and ease of description thereof. However, the disclosure is not limited to the illustrated sizes and thicknesses. In the drawings, the thicknesses of layers, films, panels, regions, and other elements, may be exaggerated for clarity. In the drawings, for better understanding and ease of description, the thicknesses of some layers and areas may be exaggerated. FIG. 1 is a schematic plan view of a display device according to an embodiment.

Referring to FIG. 1, a display device 10 displays a moving image or a still image. The display device 10 may refer to various types of electronic devices that provide a display screen. Examples of the display device 10 may include a television (TV), a notebook computer, a monitor, a billboard, an Internet-of-Things (IoT) device, a mobile phone, a smartphone, a tablet personal computer (PC), an electronic clock, a smartwatch, a watchphone, a head-mounted display (HMD), a mobile communication terminal, an electronic notebook, an electronic book (e-book) reader, a portable multimedia player (PMP), a navigation device, a gaming console, a digital camera, a camcorder, an automotive display, and the like.

The display device 10 may include a display panel which provides a display screen. Examples of the display panel may include a light-emitting diode (LED) display panel, an organic LED (OLED) display panel, a quantum-dot LED (QLED) display panel, a plasma display panel (PDP), a field emission display (FED) panel, and the like. The display panel will hereinafter be described as being an LED display panel, but the disclosure is not limited thereto. For example, various display panels other than an LED display panel may also be applicable to the display panel of this disclosure.

The shape of the display device 10 may vary. For example, the display device 10 may have a rectangular shape that extends longer in a horizontal direction than in the vertical direction, a rectangular shape that extends longer in the vertical direction than in the horizontal direction, a square shape, a rectangular shape with rounded corners, another polygonal shape, or a circular shape. The display device 10 may include a display area DA which may have a similar shape as the display device 10. FIG. 1 illustrates that each of the display device 10 and the display area DA is in the shape of a rectangle that extends longer in the horizontal direction than in the vertical direction.

The display device 10 may include the display area DA and a non-display area NDA. The display area DA may be an area in which an image can be displayed, and the non-display area NDA may be an area in which no image is displayed. The display area DA may also be referred to as an active area, and the non-display area NDA may also be referred to as an inactive area.

Figure 2A:
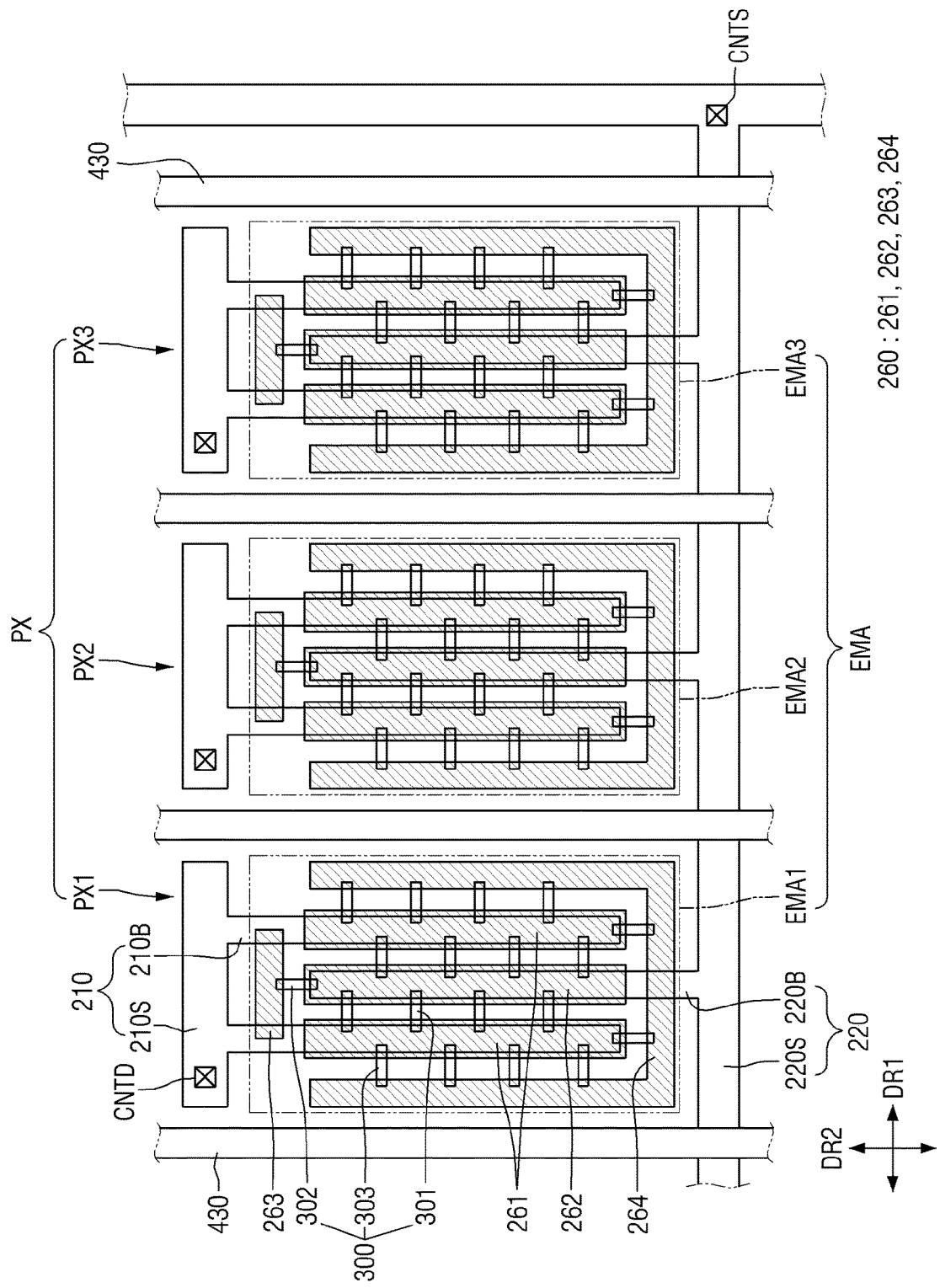
FIG. 2A is a schematic plan view illustrating a pixel of the display device of FIG. 1.
Figure 3:
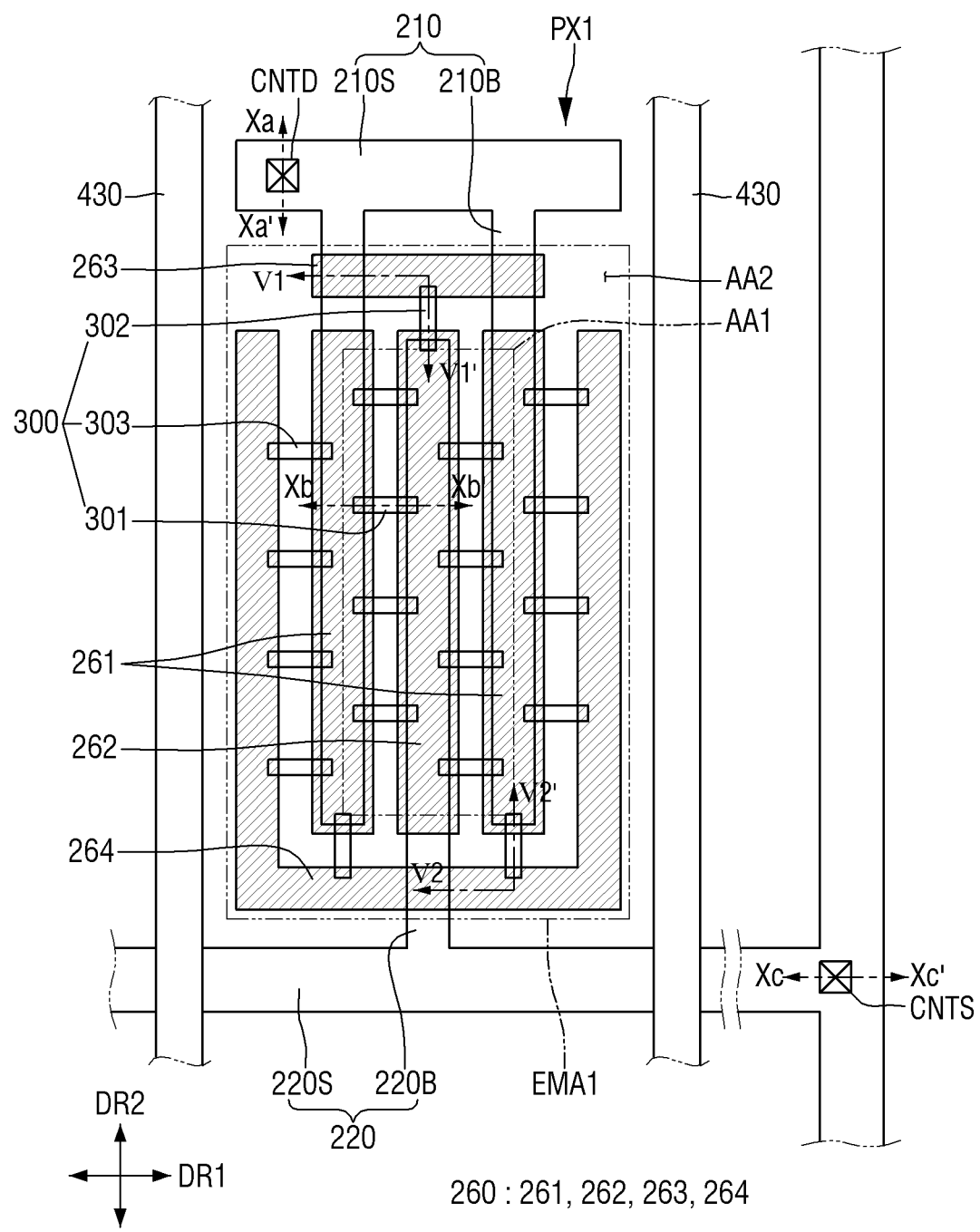
FIG. 3 is a schematic plan view illustrating a subpixel illustrated in FIG. 2A.

The display area DA may be disposed at a central portion of the display device 10. The display area DA may include multiple pixels PX. The pixels PX may be arranged in row and column directions. The pixels PX may have a rectangular or square shape in a plan view, but the disclosure is not limited thereto. Each of the pixels PX may include one or more light-emitting elements 300 each emitting light of a particular wavelength band so as to emit light of a particular color. FIG. 2A is a schematic plan view illustrating a pixel of the display device of FIG. 1. FIG. 3 is a schematic plan view illustrating a subpixel illustrated in FIG. 2A.

Referring to FIGS. 2A and 3, a pixel PX may include multiple subpixels PXn, for example, first, second, and third subpixels PX1, PX2, and PX3. The first subpixel PX1 may emit light of a first color, the second subpixel PX2 may emit light of a second color, and the third subpixel PX3 may emit light of a third color. The first, second, and third colors may be blue, green, and red, respectively, but the disclosure is not limited thereto. For example, the subpixels PXn of the pixel PX may emit light of the same color. FIGS. 2A and 3 illustrate that the pixel PX includes three subpixels PXn, but the disclosure is not limited thereto. For example, the pixel PX may include more than three subpixels PXn.

Figure 2B:
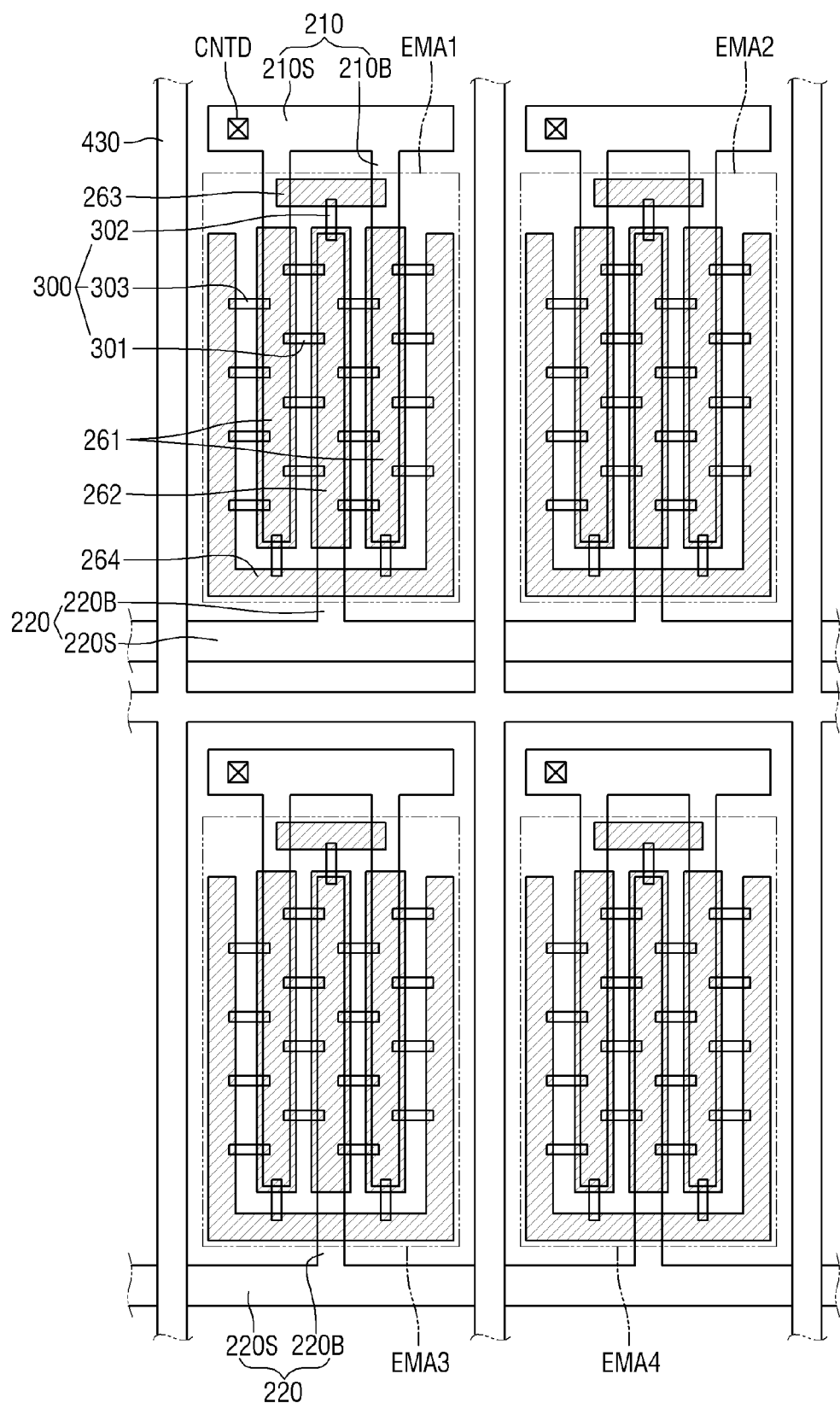
FIG. 2B is a schematic plan view illustrating a pixel of the display device in another embodiment.

FIG. 2B is a schematic plan view illustrating a pixel of the display device of FIG. 1 in another embodiment. Referring to FIG. 2B, a pixel PX includes four subpixels, i.e., first, second, third, and fourth subpixels PX1, PX2, PX3, and PX4. The first subpixel PX1 may emit light of a first color, the second subpixel PX2 may emit light of a second color, the third subpixel PX3 may emit light of a third color, and the fourth subpixel PX4 may emit light of a fourth color. For example, the first, second, third, and fourth colors may be blue, green, red, and green, respectively. However, the configuration of colors is not limited thereto.

Referring to FIGS. 2A and 3, each of the subpixels PXn of the pixel PX may include an emission area EMA. The first subpixel PX1 may include a first emission area EMA1, the second subpixel PX2 may include a second emission area EMA2, and the third subpixel PX3 may include a third emission area EMA3. The emission area EMA of each of the subpixels PXn may be defined as an area in which light-emitting elements 300 may be disposed to emit light of a particular wavelength range. Each of the light-emitting elements 300 may include an active layer 330, and the active layer 330 may emit light of a particular wavelength range without any directionality. For example, light may be emitted from the active layer 330 not only in the directions of ends (or opposite ends) of a corresponding light-emitting element 300, but also in the directions of the sides of the corresponding light-emitting element 300. The emission area EMA of each of the subpixels PXn may include regions where the light-emitting elements 300 are disposed and may also include regions adjacent to the light-emitting elements 300 where light is emitted in the directions of the sides of each of the light-emitting elements 300, but the disclosure is not limited thereto. For example, the emission area EMA of each of the subpixels PXn of the pixel PX may also include regions where light emitted from the light-emitting elements 300 is reflected or refracted by another element to be emitted. The light-emitting elements 300 may be disposed in each of the subpixels PXn of the pixel PX and may form an emission area EMA including the regions where the light-emitting elements 300 are disposed and regions adjacent to the regions where the light-emitting elements 300 are disposed.

Although not specifically illustrated, each of the subpixels PXn may include not only the emission area EMA, but also a non-emission area. The non-emission area may be defined, for example, as an area in which no light-emitting element is disposed so that no light arrives or is emitted.

Figure 4:
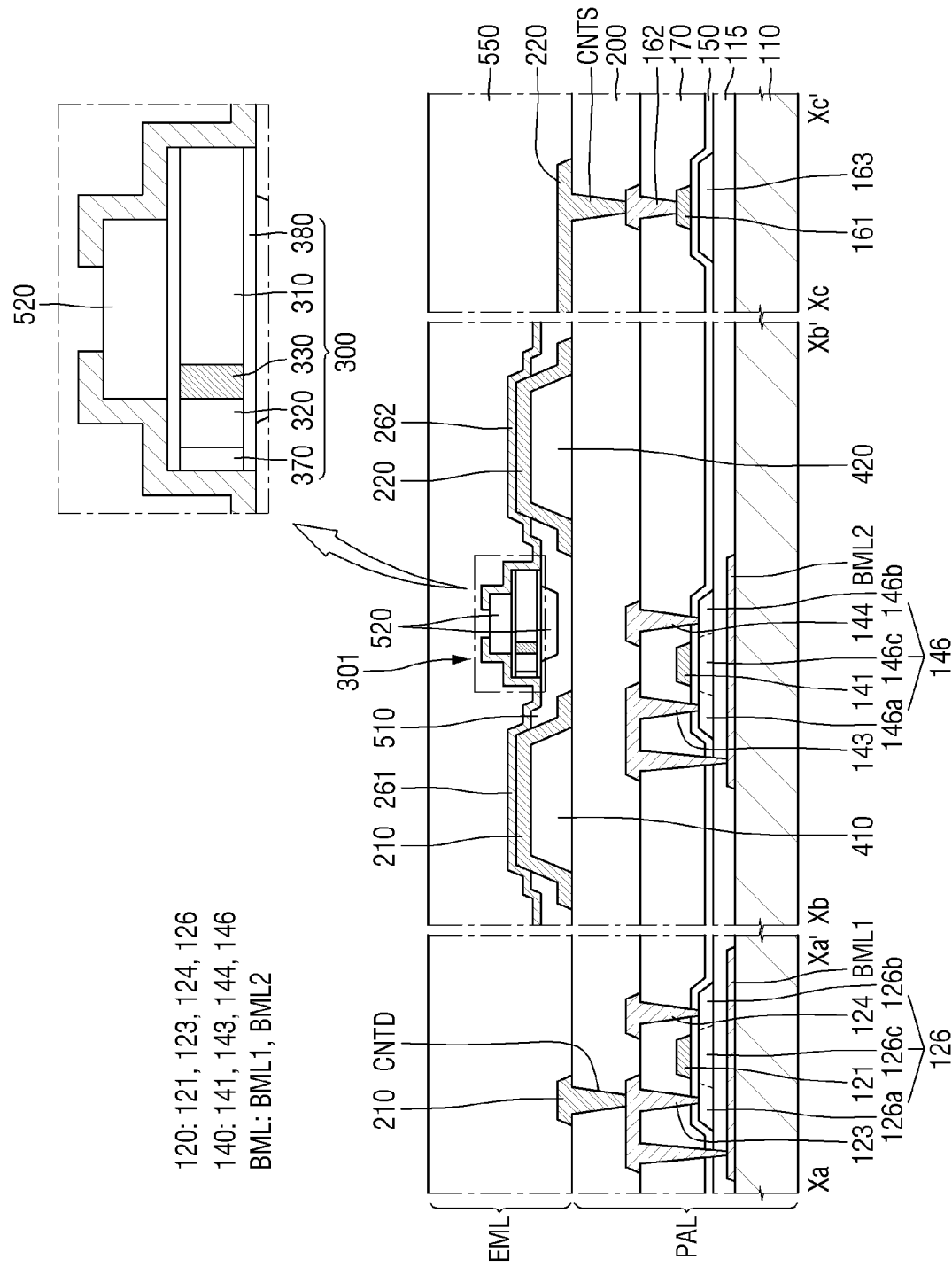
FIG. 4 is a schematic cross-sectional view taken along lines Xa-Xa', Xb-Xb', and Xc-Xc' of FIG. 3.

Each of the subpixels PXn of the pixel, for example, the first subpixel PX1, may include electrodes (210 and 220), light-emitting elements 300, contact electrodes 260, inner banks (410 and 420 of FIG. 4), outer banks 430, and one or more insulating layers (510, 520, and 550 of FIG. 4).

The electrodes (210 and 220) may be electrically connected to the light-emitting elements 300 and may receive a voltage for allowing the light-emitting elements 300 to emit light of a particular wavelength range. At least some of the electrodes (210 and 220) may be used to form an electric field in the first subpixel PX1 to align the light-emitting elements 300.

The electrodes (210 and 220) may include first and second electrodes 210 and 220. The first electrode 210 may be a pixel electrode disposed in each of the subpixels PXn of the pixel PX, and the second electrode 220 may be a common electrode connected across all the subpixels PXn of the pixel PX. The first and second electrodes 210 and 220 may be anode and cathode electrodes, respectively, of each of the light-emitting elements 300 or vice versa, but the disclosure is not limited thereto.

The first electrode 210 may include a first electrode stem 210S which extends in a first direction DR1 and at least one first electrode branch 210B, for example, two first electrode branches 210B which extend, from the first electrode stem 210S, in a second direction DR2 that intersects the first direction DR1 and branched off from the electrode stem 210S. The second electrode 220 may include a second electrode stem 220S which extends in the first direction DR1 and at least one second electrode branch 220B, for example, a second electrode branch 220B which extends in the second direction DR2 from the second electrode stem 220S and branched off from the second electrode stem 220S.

The first electrode stem 210S may be terminated at ends thereof at a distance from sides of the first subpixel PX1 and may be placed substantially on the same line with other first electrode stems 210S from subpixels PXn that belong to the same row (in the first direction DR1) as the first subpixel PX1. Since the ends of the first electrode stem 210S are spaced apart from the sides of the first subpixel PX1, the first electrode stem 210S can apply different electrical signals to the first electrode branches 210B, and as a result, the first electrode branches 210B can be driven separately.

The first electrode branches 210B may be branched off from at least a portion of the first electrode stem 210S, may extend in the second direction DR2, and may be terminated at a distance from the second electrode stem 220S, which faces the first electrode stem 210S.

The second electrode 220 may include the second electrode stem 220S, which is spaced apart from, and faces, the first electrode stem 210S in the second direction DR2, and the second electrode branch 220B, which is branched off from the second electrode stem 220S and extend in the second direction DR2. The second electrode stem 220S may be electrically connected to second electrode stems 220S of subpixels PXn that are adjacent to the first subpixel PX1 in the first direction DR1. For example, the second electrode stem 220S, unlike the first electrode stem 210S, may extend in the first direction DR1 to extend across the first subpixel PX1 and the subpixels PXn that are adjacent to the first subpixel PX1 in the first direction DR1. Portions of the second electrode stem 220S that extend across the first subpixel PX1 and the subpixels PXn that are adjacent to the first subpixel PX1 may be electrical connected to a portion of the second electrode stem 220S that extends on the outside of the display area DA or in the non-display area NDA.

The second electrode branch 220B may be spaced apart from, and face, the first electrode branches 210B and may be terminated at a distance from the first electrode stem 210S. The second electrode branch 220B may be electrical connected to the second electrode stem 220S and may be disposed in the first subpixel PX1 to be apart from the first electrode stem 210S.

The first and second electrodes 210 and 220 may be electrically connected to a circuit element layer PAL of the display device 10 via, for example, first and second electrode contact holes CNTD and CNTS, respectively. FIGS. 2A and 3 illustrate that the first electrode contact hole CNTD is formed in each of the subpixels PXn of the pixel PX, in the first electrode stem 210S, and that the second electrode contact hole CNTS is formed in the second electrode stem 220S that extends across all the subpixels PXn of the pixel PX, but the disclosure is not limited thereto. For example, the second electrode contact hole CNTS may also be formed in each of the subpixels PXn of the pixel PX.

FIGS. 2A and 3 illustrate that two first electrode branches 210B are disposed in each of the subpixels PXn of the pixel PX, and that one second electrode branch 220B is disposed between the two first electrode branches 210B, but the disclosure is not limited thereto. The first and second electrodes 210 and 220 may not necessarily extend in only one direction and may be disposed in various directions and arrangements other than that set forth herein. For example, the first and second electrodes 210 and 220 may be partially curved or bent, or one of the first and second electrodes 210 and 220 may be disposed to surround the other electrode. The structures and the shapes of the first and second electrodes 210 and 220 are not limited to the particular embodiments as long as the first and second electrodes 210 and 220 are spaced apart from, and face, each other at least partially, so that the light-emitting elements 300 can be disposed therebetween.

In other embodiments, the first and second electrode stems 210S and 220S may not be provided. The first and second electrodes 210 and 220 may only include parts that extend in one direction and may be spaced apart from each other in the first subpixel PX1. This will be described later in detail.

The inner banks (410 and 420) may be disposed at the center (or adjacent to the center) of the first subpixel PX1, below the first and second electrodes 210 and 220. For example, the inner banks may include first inner banks 410 and a second inner bank 420 which may be disposed below the first electrode branches 210B and the second electrode branch 220B, respectively. This will be described later in detail.

The outer banks 430 may be disposed along the boundaries between the subpixels PXn of the pixel PX. The first electrode stem 210S may be terminated at a distance from the outer banks 430. The outer banks 430 may extend in the second direction DR2 and may be disposed along the boundaries between subpixels PXn arranged in the first direction DR1, but the disclosure is not limited thereto. For example, the outer banks 430 may also be disposed between subpixels PXn arranged in the second direction DR2. The outer banks 430 may include the same material as the inner banks (410 and 420) and may be formed together with the inner banks (410 and 420).

The light-emitting elements 300 may be disposed between the first and second electrodes 210 and 220 or in regions where the first and second electrodes 210 and 220 do not face each other. The light-emitting elements 300 may include first light-emitting elements 301 which are disposed in an area between the first electrode branches 210B and the second electrode branch 220B and a second light-emitting element 302 and third light-emitting elements 303 which are disposed in regions other than (or outside of) regions between the first electrode branches 210B and the second electrode branch 220B. Although the second light-emitting element 302 is referred to as singular in the description, it may be plural in various embodiments.

The first subpixel PX1 may include a first area AA1 corresponding to the regions between the first and second electrodes 210 and 220 and a second area AA2 corresponding to the area other than (or outside of) the first area AA1 of the first subpixel PX1. For example, the first area AA1 may correspond to the regions between the first electrode branches 210B and the second electrode branch 220B, which both extend in the second direction DR2, and the second area AA2 may correspond to the area outside of the first area AA1 of the first subpixel PX1. The first area AA1 may be understood as being an area where the first electrode branches 210B and the second electrode branch 220B face each other, and the second area AA2 may be understood as being an area where the first electrode branches 210B and the second electrode branch 220B do not face each other.

During the fabrication of the display device 10, the light-emitting elements 300 may be sprayed into the first subpixel PX1 while being dispersed in ink. The ink may be placed in a region defined by the outer banks 430, and the light-emitting elements 300 may be disposed between the first and second electrodes 210 and 220 by electrical signals applied to the first and second electrodes 210 and 220. The electrical signals applied to the first and second electrodes 210 and 220 may form an electric field between the first and second electrodes 210 and 220, and the light-emitting elements 300 may be disposed in regions where the first electrode branches 210B and the second electrode branch 220B are spaced apart from, and face, each other. For example, some of the light-emitting elements 300 may be disposed in the first area AA1 between the first electrode branches 210B and the second electrode branch 220B. Ends (for example, ends in a longitudinal direction) of each of light-emitting elements 300 disposed in the first area AA1, i.e., the first light-emitting elements 301, may be disposed on the first and second electrodes 210 and 220 or on the first electrode branches 210B and the second electrode branch 220B.

Some of the light-emitting elements 300 may be disposed even in the regions where the first and second electrodes 210 and 220 do not face each other, for example, in the regions where the first electrode branches 210B and the second electrode branch 220B do not face each other. An end of each of light-emitting elements 300 disposed in the second area AA2 may be located on the first or second electrode 210 or 220, and another end of each of the light-emitting elements 300 disposed in the second area AA2 may not be located on the first or second electrode 210 or 220. The display device 10 may include the first light-emitting elements 301, which are disposed in the first area AA1 and each have the ends (for example, the ends in the longitudinal direction) disposed on the first and second electrodes 210 and 220, and the second light-emitting electrode 302 and the third light-emitting electrodes 303, which are disposed in the second area AA2 and each have only one end disposed on the first or second electrode 210 or 220.

An end of each of the first light-emitting elements 301 may be disposed on the first electrode 210 or on the first electrode branches 210B, and another end of each of the first light-emitting elements 301 may be disposed on the second electrode 220 or on the second electrode branch 220B. However, the disclosure is not limited to this. For example, at least one end of each of the first light-emitting elements 301 may not be disposed on the first or second electrode 210 or 220. The first light-emitting elements 301 may be understood as being the light-emitting elements 300 disposed in the first area AA1, which accounts for regions between the first and second electrodes 210 and 220 that face each other.

An end of each of the second light-emitting element 302 and of the third light-emitting elements 303 may be disposed on the first or second electrode 210 or 220, and another end of each of the second light-emitting element 302 and of the third light-emitting elements 303 may not be disposed on the first or second electrode 210 or 220. For example, at least one end of each of the second light-emitting element 302 and of the third light-emitting elements 303 may not be disposed on the first or second electrode 210 or 220. However, the disclosure is not limited to this, and the second light-emitting element 302 and the third light-emitting elements 303 may be disposed in the regions where the first and second electrodes 210 and 220, or the first electrode branches 210B and the second electrode branch 220B, face each other. In other words, the second light-emitting element 302 and the third light-emitting elements 303 may be understood as being the light-emitting elements 300 disposed in the second area AA2, which accounts for an area outside of the first area AA1.

An end of each of the light-emitting elements 300 may be electrically connected to the first electrode 210, and another end of each of the light-emitting elements 300 may be electrically connected to the second electrode 220. For example, the two ends of each light-emitting element may be two ends of each light-emitting element in its longitudinal direction. The first light-emitting elements 301, the second light-emitting element 302, and the third light-emitting elements 303 may be electrically connected to the first and second electrodes 210 and 220 via contact electrodes 260.

The light-emitting elements 300 may be spaced apart from one another and may be aligned substantially in substantially parallel to one another. The distances between the light-emitting elements 300 are not limited to particular values. Some of the light-emitting elements 300 may be arranged adjacent to one another, and other light-emitting elements 300 may be apart from one another with a particular distance. The light-emitting elements may be arranged in one direction with a non-uniform density. The light-emitting elements 300 may extend in one direction, and the direction in which the light-emitting elements 300 extend may form a substantially right angle with the direction in which the first and second electrodes 210 and 220 (for example, the first electrode branches 210B and the second electrode branch 220B) extend. However, the disclosure is not limited to this. For example, the light-emitting elements 300 may be arranged at an inclination with respect to the direction in which the first electrode branches 210B and the second electrode branch 220B extend. The direction in which the second light-emitting element 302 or the third light-emitting elements 303 extend may be substantially parallel to the direction in which the first electrode branches 210B and the second electrode branch 220B extend.

The direction in which the first light-emitting elements 301 extend may be substantially parallel to the first direction DR1. The first sides and the second sides of the first light-emitting elements 301 may be disposed on the first electrode branches 210B and the second electrode branch 220B, respectively, which are spaced apart in the first direction DR1 from the first electrode branches 210B, and may be electrically connected with first contact electrodes 261 and a second contact electrode 262, respectively.

In contrast, the direction in which at least some of the third light-emitting elements 303 extend may be substantially parallel to the first direction DR1, and the direction in which the second light-emitting element 302 and the other third light-emitting elements 303 extend may be substantially parallel to the second direction DR2. FIGS. 2A and 3 illustrate that the first side of the second light-emitting element 302 in the second area AA2 is disposed on the second electrode branch 220B, and that the direction in which the second light-emitting element 302 extends is substantially parallel to the second direction DR2. Also, FIGS. 2A and 3 illustrate that the first sides of the third light-emitting elements 303 in the second area AA2 are disposed on the first electrode branches 210B, that the direction in which some of the third light-emitting elements 303 extend is substantially parallel to the first direction DR1, and that the direction in which some of the third light-emitting elements 303 extend is substantially parallel to the second direction DR2. For example, the direction in which the light-emitting elements 300 extend is not limited.

The display device 10 may include, in the first subpixel PX1, the first light-emitting elements 301, which are disposed in the first area AA1 and extend in the first direction DR1, and the second light-emitting element 302 and the third light-emitting elements 303, which are disposed in the second area AA2 and extend in the first direction DR1 or in the second direction DR2. The light-emitting elements 300 may be electrically connected to the first and second electrodes 210 and 220 via the contact electrodes 260 and can emit light of a particular wavelength range even if they are not disposed in the first area AA1.

The active layers 330 of the light-emitting elements 300 of one subpixel PXn of the pixel PX may include a different material, and thus emit light of a different wavelength range, from the active layers 330 of the light-emitting elements 300 of another subpixel PXn of the pixel PX. The display device 10 may include multiple groups of light-emitting elements 300 which emit light of different wavelength ranges. The multiple groups of light-emitting elements 300, which are disposed in different subpixels PXn of the pixel PX, may include multiple groups of active layers 330, respectively, which have the same structure, but emit different of light. Light-emitting elements 300 of the first subpixel PX1 may include active layers 330 which emit first light L1 whose central wavelength is a first wavelength, light-emitting elements 300 of the second subpixel PX2 may include active layers 330 which emit second light L2 whose central wavelength is a second wavelength, and light-emitting elements 300 of the third subpixel PX3 may include active layers 330 which emit third light L3 whose central wavelength is a third wavelength.

Accordingly, the first light L1 may be emitted from the first subpixel PX1, the second light L2 may be emitted from the second subpixel PX2, and the third light L3 may be emitted from the third subpixel PX3. In some embodiments, the first light L1 may be blue light having a central wavelength range of about 450 nm to about 495 nm, the second light L2 may be green light having a central wavelength range of about 495 nm to about 570 nm, and the third light L3 may be red light having a central wavelength range of about 620 nm to about 752 nm.

However, the disclosure is not limited to this. The first light L1, the second light L2, and the third light L3 may be light of different colors or may be light of the same color, but may have different central wavelength ranges. The groups of light-emitting elements 300 of the first, second, and third subpixels PX1, PX2, and PX3 may all be of the same type, and thus, the first, second, and third subpixels PX1, PX2, and PX3 may emit light of substantially the same color.

Although not specifically illustrated in FIGS. 2A and 3, the display device 10 may include, in the first subpixel PX1, a first insulating layer 510 which at least partially covers the first and second electrodes 210 and 220.

The first insulating layer 510 may be disposed in each of the subpixels PXn of the pixel PX. The first insulating layer 510 may be disposed to substantially entirely cover each of the subpixels PXn of the pixel PX and to extend even to their respective neighboring pixels PXn. The first insulating layer 510 may be disposed to at least partially overlap the first and second electrodes 210 and 220 in a plan view. Although not specifically illustrated in FIGS. 2A and 3, the first insulating layer 510 may be disposed to expose parts of the first and second electrodes 210 and 220, parts of the first electrode branches 210B and of the second electrode branch 220B.

The contact electrodes 260 may extend, at least in part, in one direction. The contact electrodes 260 may be electrically connected with the light-emitting elements 300 and the first and second electrodes 210 and 220 and may receive electrical signals from the first and second electrodes 210 and 220 via the contact electrodes 260.

The contact electrodes 260 may include first contact electrodes 261, a second contact electrode 262, a third contact electrode 263, and a fourth contact electrode 264. The first contact electrodes 261 and the second contact electrode 262 may be disposed on the first electrode branches 210B and the second electrode branch 220B, respectively, and the third and fourth contact electrodes 263 and 264 may be disposed on the first insulating layer 510 (refer to FIG. 4) and, in part, on the first and second electrodes 210 and 220, respectively.

The first contact electrodes 261 may be disposed on the first electrode 210, on the first electrode branches 210B, to extend in the second direction DR2. The first contact electrodes 261 may be electrically connected with the first sides of the first light-emitting elements 301, which are disposed in the first area AA1, and one end of each of the third light-emitting elements 303, which are disposed in the second area AA2, on the first electrode branches 210B. Also, as will be described later, the first contact electrodes 261 may be in electrical contact with portion of the first electrode 210 exposed due to the absence of the first insulating layer 510. Accordingly, the first light-emitting elements 301 and the third light-emitting elements 303 may be electrically connected to the first electrode 210 via the first contact electrodes 261.

The second contact electrode 262 may be disposed on the second electrode 220 (or the second electrode branch 220B) to extend in the second direction DR2. The second contact electrode 262 may be spaced apart from the first contact electrodes 261 in the first direction DR1. The second contact electrodes 262 may be electrically connected with the first light-emitting elements 301, which are disposed in the first area AA1, and the second light-emitting element 302, which is disposed in the second area AA2, on the second electrode branch 220B. Also, as will be described later, the second contact electrode 262 may be electrically connected with portion of the second electrode 220 exposed due to the absence of the first insulating layer 510. Accordingly, the first light-emitting elements 301 and the second light-emitting element 302 may be electrically connected to the second electrode 220 via the second contact electrode 262. FIGS. 2A and 3 illustrate that two first contact electrodes 261 and one second contact electrode 262 are disposed in each of the subpixels PXn of the pixel PX, but the disclosure is not limited thereto. The numbers of first contact electrodes 261 and second contact electrodes 252 may vary depending on the numbers of first electrodes 210 and second electrodes 220 disposed in each of the subpixels PXn of the pixel PX or the numbers of first electrode branches 210B and second electrode branches 220B disposed in each of the subpixels PXn of the pixel PX.

In the embodiments, the light-emitting elements may be electrically connected and/or physically connected with the contact electrodes, and/or may overlap (or partially overlap) the contact electrodes in a plan view.

The widths, in one direction, of the first contact electrodes 261 and the second contact electrode 262 may be greater than the widths, in one direction, of the first and second electrodes 210 and 220 or the widths, in one direction, of the first electrode branches 210B and the second electrode branch 220B. The first contact electrodes 261 and the second contact electrode 262 may be disposed to cover the sides of each of the first and second electrodes 210 and 220, particularly, the sides of each of the first electrode branches 210B and of the second electrode branch 220B. The first contact electrodes 261 and the second contact electrode 262 may be electrically connected with an end of each of light-emitting elements 300 disposed on sides of each of the first electrode branches 210B and of the second electrode branch 220B. For example, the first contact electrodes 261 may be electrically connected with an end of each of the first light-emitting elements 301 and an end of each of the third light-emitting elements 303, and the second contact electrode 262 may be electrically connected with another end of each of the first light-emitting elements 301. The first contact electrodes 261 and the second contact electrode 262 may also be electrically connected with an end of each of light-emitting elements 300 disposed at the ends of the first electrode branches 210B and of the second electrode branch 220B.

The first contact electrodes 261 and the second contact electrode 262 may be in electrical contact with an end of each of the first light-emitting elements 301, which are disposed in the first area AA1, and an end of each of the second light-emitting element 302 and the third light-emitting elements 303, which are disposed in the second area AA2. Thus, the first contact electrodes 261 and the second contact electrode 262 may be disposed, at least in part, in the first area AA1 and may thus be in electrical contact with the first and second electrodes 210 and 220, respectively, in the first area AA1.

The third and fourth contact electrodes 263 and 264 may be in electrical contact with another end of each of the light-emitting elements 300 disposed in the second area AA2, i.e., the other end of each of the second light-emitting element 302 and the third light-emitting elements 303. An end of the third contact electrode 263 may be in electrical contact with another end of the second light-emitting element 302, which is in electrical contact with the second contact electrode 262, and an end of the fourth contact electrode 264 may be in electrical contact with another end of each of the third light-emitting elements 303, which are in electrical contact with the first contact electrodes 261.

The third contact electrode 263 may be in electrical contact with another end of the second light-emitting element 302 and may also be at least partially in electrical contact with the first electrode 210. The third contact electrode 263 may be in electrical contact with the second light-emitting element 302 and the first electrode 210 in regions where the third contact electrode 263 overlaps with the first electrode branches 210B. Thus, the second light-emitting element 302 may be electrically connected to the first electrode 210. The fourth contact electrode 264 may be in electrical contact with another end of each of the third light-emitting elements 303 and may also be at least electrically connected with the second electrode 220. The fourth contact electrode 264 may at least partially overlap the second electrode 220. The fourth contact electrode 264 may be electrically connected with the third light-emitting elements 303 and the second electrode 220 in a region where the fourth contact electrode 264 overlaps with the second electrode branch 220B. Thus, the third light-emitting elements 303 may be electrically connected to the second electrode 220. For example, the third and fourth contact electrodes 263 and 264 may be disposed in the second area AA2 and may thus be electrically connected with the first and second electrodes 210 and 220, respectively, in the second area AA2.

However, the disclosure is not limited to this. As another example, the third and fourth contact electrodes 263 and 264 may be electrically connected with other parts of the first and second electrodes 210 and 220, for example, the first and second electrode stem parts 210S and 220S. Also, the third and fourth contact electrodes 263 and 264 may be electrically connected to the first contact electrodes 261 and the second contact electrode 262, respectively, and may thus be electrically connected to the first and second electrodes 210 and 220, respectively.

The shapes of the third and fourth contact electrodes 263 and 264 are not limited to a particular shape as long as the third and fourth contact electrodes 263 and 264 may overlap an end of each of the light-emitting elements 300 disposed in the second area AA2 and with the first or second electrode 210 or 220 in a plan view. In some embodiments, the third and fourth contact electrodes 263 and 264 may include parts that extend at least in one direction. For example, as illustrated in FIGS. 2A and 3, the third contact electrode 263 may include a first portion that extends in the first direction DR1, and the fourth contact electrode 264 may include a first portion that extends in the first direction DR1 and a second portion that extends in the second direction DR2. In another example, the third contact electrode 263 may include a second portion that extends in the second direction DR2, and the fourth contact electrode 264 may include only a first portion that extends in the first direction DR1. These examples will be described later in detail.

The third contact electrode 263 may be disposed adjacent to the first electrode stem 210S to be electrically connected with the other end of the second light-emitting element 302 and with the first electrode 210, and the fourth contact electrode 264 may be disposed adjacent to the second electrode stem 220S to be electrically connected with the other end of each of the third light-emitting elements 303 and with the second electrode 220. Accordingly, the fourth contact electrode 264 may surround the first electrode branches 210B. However, the shapes of the third and fourth contact electrodes 263 and 264 are not particularly limited as long as the third and fourth contact electrodes 263 and 264 can be spaced apart from, and face, the first contact electrodes 261 and the second contact electrode 262.

The third and fourth contact electrodes 263 and 264 may be disposed such that the light-emitting elements 300 disposed in the regions where the first electrode branches 210B and the second electrode branch 220B do not face each other, for example, in the second area AA2, can be electrically connected to the first and second electrodes 210 and 220. During the fabrication of the display device 10, the light-emitting elements 300 disposed in the regions outside of the regions between the first electrode branches 210B and the second electrode branch 220B may not be electrical connected to the first and second electrodes 210 and 220 and thus may not receive electrical signals. However, since the third and fourth contact electrodes 263 and 264 are further provided, the light-emitting elements 300 disposed in the regions outside of the regions between the first electrode branches 210B and the second electrode branch 220B can be electrically connected to the first and second electrodes 210 and 220. Accordingly, the number of light-emitting elements 300 that may be lost can be minimized, and the emission rate of each of the subpixels PXn of the pixel PX can be improved.

The display device 10 may include, in the first subpixel PX1, not only the first insulating layer 510, but also a circuit element layer PAL which is disposed below the first and second electrodes 210 and 220 and a second insulating layer 520 (of FIG. 4) and a passivation layer 550 (of FIG. 4) which are disposed to at least partially cover the first and second electrodes 210 and 220 and the light-emitting elements 300. The structure of the display device 10 will hereinafter be described in further detail with reference to FIG. 4.

FIG. 4 is a schematic cross-sectional view taken along lines Xa-Xa', Xb-Xb', and Xc-Xc' of FIG. 3.

FIG. 4 illustrates a cross-sectional view of the first subpixel PX1, but the following description of the first subpixel PX1 may also be applicable to other pixels PX or other subpixels PXn. Specifically, FIG. 4 illustrates a cross-sectional view taken along a line that extends from one end to the other end of a light-emitting element 300 disposed in the first area AA1, i.e., a first light-emitting element 301.

Referring to FIGS. 2A and 3 and further to FIG. 4, the display device 10 may include the circuit element layer PAL and an emission layer EML. The circuit element layer PAL may include a substrate 110, a buffer layer 115, light-blocking layers BML, and first and second transistors 120 and 140, and the emission layer EML may include first and second electrodes 210 and 220, a light-emitting element 300, and insulating layers (510, 520, and 550) which are disposed on the first and second transistors 120 and 140.

The substrate 110 may be an insulating substrate. The substrate 110 may be formed of an insulating material such as glass, quartz, or a polymer resin. The substrate 110 may be a rigid substrate or may be a flexible substrate that is bendable, foldable, or rollable.

The light-blocking layers BML may be disposed on the substrate 110. The light-blocking layers BML may include first and second light-blocking layers BML1 and BML2. The first light-blocking layer BML1 may be electrically connected to a first drain electrode 123 of the first transistor 120. The second light-blocking layer BML2 may be electrically connected to a second drain electrode 143 of the second transistor 140.

The first light-blocking layer BML1 is disposed to overlap with a first active material layer 126 of the first transistor 120, and the second light-blocking layer BML2 is disposed to overlap with a second active material layer 146 of the second transistor 140. The first and second light-blocking layers BML1 and BML2 include a material capable of blocking the transmission of light and can thus prevent light from being incident upon the first and second active material layers 126 and 146. For example, the first and second light-blocking layers BML1 and BML2 may be formed of an opaque metallic material capable of blocking the transmission of light, but the disclosure is not limited thereto. In some embodiments, the light-blocking layers BML may not be provided.

The buffer layer 115 is disposed on the light-blocking layers BML and on the substrate 110. The buffer layer 115 may be disposed to cover the entire substrate 110 including the light-blocking layers BML. The buffer layer 115 may prevent the diffusion of impurity ions and the penetration of moisture or external air and may perform surface planarization. Also, the buffer layer 115 may insulate the light-blocking layer BML and the first and second active material layers 126 and 146.

A semiconductor layer is disposed on the buffer layer 115. The semiconductor layer may include the first active material layer 126 of the first transistor 120, the second active material layer 146 of the second transistor 140, and an auxiliary layer 163. The semiconductor layer may include polycrystalline silicon, monocrystalline silicon, an oxide semiconductor, or the like.

The first active material layer 126 may include a first doped region 126a, a second doped region 126b, and a first channel region 126c. The first channel region 126c may be disposed between the first and second doped regions 126a and 126b. The second active material layer 146 may include a third doped region 146a, a fourth doped region 146b, and a second channel region 146c. The second channel region 146c may be disposed between the third and fourth doped regions 146a and 146b. For example, the first and second active material layers 126 and 146 may include polycrystalline silicon, which may be formed by crystallizing amorphous silicon through rapid thermal annealing (RTA), solid phase crystallization (SPC), excimer laser annealing (ELA), metal-induced crystallization (MILC), or sequential lateral solidification (SLS), but the disclosure is not limited thereto. In another example, the first and second active material layers 126 and 146 may include monocrystalline silicon, low-temperature polycrystalline silicon, or amorphous silicon. The first, second, third, and fourth doped regions 126a, 126b, 146a, and 146b may be parts of the first and second active material layers 126 and 146 that are doped with impurities, but the disclosure is not limited thereto.

The material of the first and second active material layers 126 and 146 is not limited to those mentioned above. In yet another example, the first and second active material layers 126 and 146 may include an oxide semiconductor. In this example, the first and third doped regions 126a and 146a may be first conductorized regions, and the second and fourth doped regions 126b and 146b may be second conductorized regions. Here, at least one portion of active material layer may be conductible by increasing the conductive characteristics by doping or the like. In a case where the first and second active material layers 126 and 146 include an oxide semiconductor, the oxide semiconductor may contain indium (In). In some embodiments, the oxide semiconductor may be indium tin oxide (ITO), indium zinc oxide (IZO), indium gallium oxide (IGO), indium zinc tin oxide (ITZO), indium gallium tin oxide (IGTO), or indium gallium zinc tin oxide (IGZTO), but the disclosure is not limited thereto.

A first gate insulating layer 150 is disposed on the semiconductor layer. The first gate insulating layer 150 may be disposed to cover the entire buffer layer 115 including the semiconductor layer. The first gate insulating layer 150 may serve as a gate insulating layer for the first and second transistors 120 and 140.

A first conductive layer is disposed on the first gate insulating layer 150. The first conductive layer may include a first gate electrode 121 which is disposed on the first active material layer 126 of the first transistor 120, a second gate electrode 141 which is disposed on the second active material layer 146 of the second transistor 140, and a power supply line 161 which is disposed on the auxiliary layer 163. The first gate electrode 121 may overlap with the first channel region 126c of the first active material layer 126, and the second gate electrode 141 may overlap with the second channel region 146c of the second active material layer 146.

An interlayer insulating layer 170 is disposed on the first conductive layer. The interlayer insulating layer 170 may include an organic insulating material and may perform surface planarization.

A second conductive layer is disposed on the interlayer insulating layer 170. The second conductive layer includes a first drain electrode 123 and a first source electrode 124 of the first transistor 120, a second drain electrode 143 and a second source electrode 144 of the second transistor 140, and a power supply electrode 162 which is disposed on the power supply line 161.

The first drain electrode 123 and the first source electrode 124 may be electrically connected with the first and second doped regions 126a and 126b, respectively, of the first active material layer 126 via contact holes that penetrate the interlayer insulating layer 170 and the first gate insulating layer 150. The second drain electrode 143 and the second source electrode 144 may be electrically connected with the first and second doped regions 126a and 126b, respectively, of the first active material layer 126 via contact holes that penetrate the interlayer insulating layer 170 and the first gate insulating layer 150. The first and second drain electrodes 123 and 143 may be electrically connected to the first and second light-blocking layers BML1 and BML2, respectively, via other contact holes.

A via layer 200 is disposed on the second conductive layer. The via layer 200 may include an organic insulating material and may perform surface planarization.

The inner banks (410 and 420), outer banks 430, the first and second electrodes 210 and 220, and the light-emitting element 300 may be disposed on the via layer 200.

The outer banks 430 may extend in the second direction DR2 and may be disposed along the boundaries between the first subpixel PX1 and subpixels PXn adjacent to the first subpixel PX1 in the first direction DR1, but the disclosure is not limited thereto. For example, the outer banks 430 may also be disposed along the boundaries between the first subpixel PX1 and subpixels PXn adjacent to the first subpixel PX1 in the second direction DR2. For example, the outer banks 430 may define the boundaries between the first subpixel PX1 and other subpixels PXn.

The outer banks 430 may prevent ink with the light-emitting element 300 dispersed therein from spilling over the boundaries with other subpixels PXn in case that the ink is being sprayed into the first subpixel PX1. The outer banks 430 may confine the ink with the light-emitting element 300 dispersed therein not to be mixed with ink with other light-emitting elements 300 dispersed therein, but the disclosure is not limited thereto.

The inner banks (410 and 420) may include first and second inner banks 410 and 420, which are disposed adjacent to the center of the first subpixel PX1.

The first and second inner banks 410 and 420 may be disposed to be spaced apart from, and face, each other. The first electrode 210 may be disposed on the first inner bank 410, and the second electrode 220 may be disposed on the second inner bank 420. As illustrated in FIGS. 2A and 3, a first electrode branch 210B may be disposed on the first inner bank 410, and a second electrode branch 220B may be disposed on the second inner bank 420.

The first and second inner banks 410 and 420 may be disposed in the first subpixel PX1 to extend in the second direction DR2. Although not specifically illustrated, the first and second inner banks 410 and 420 may extend in the second direction DR2 toward subpixels PXn that are adjacent to the first subpixel PX1 in the second direction DR2, but the disclosure is not limited thereto. For example, the first and second inner banks 410 and 420 may be disposed in the first subpixel PX1 to form a pattern on the entire surface of the display device 10. The inner banks (410 and 420) and the outer banks 430 may include polyimide (PI), but the disclosure is not limited thereto.

The first and second inner banks 410 and 420 may protrude, at least in part, from the via layer 200. The first and second inner banks 410 and 420 may include parts that protrude upwardly with respect to a plane where the light-emitting element 300 is disposed, and the protruding parts of the first and second inner banks 410 and 420 may be at least partially inclined. The shapes of the protruding parts of the first and second inner banks 410 and 420 are not particularly limited. Since the inner banks (410 and 420) protrude from the via layer 200 and are inclined, light emitted from the light-emitting element 300 may be reflected by the inclined sides of each of the inner banks (410 and 420). As will be described later, in a case where the first and second electrodes 210 and 220, which are disposed on the first and second inner banks 410 and 420, respectively, include a material with a high reflectivity, light emitted from the light-emitting element 300 can be reflected by parts of the first and second electrodes 210 and 220, disposed on the inclined sides of each of the first and second inner banks 410 and 420, and can thus travel upwardly from the via layer 200.

As described above, the inner banks (410 and 420) and the outer banks 430 may include the same material and may thus be formed together by the same process. The outer banks 430 may be formed along the boundaries between the first subpixel PX1 and other subpixels PXn to form a lattice pattern, whereas the inner banks (410 and 420) may be disposed in the first subpixel PX1 to extend in one direction. Also, the outer banks 430 define the first subpixel PX1 and prevent the ink sprayed into the first subpixel PX1 from spilling over the boundaries with other subpixels PXn, whereas the inner banks (410 and 420) protrude within the first subpixel PX1 and thus serve as reflecting barrier walls for reflecting light emitted from the light-emitting element 300 upwardly from the via layer 200. However, the disclosure is not limited to this.

The first and second electrodes 210 and 220 may be disposed on the via layer 200 and on the inner banks (410 and 420). As described above, the first electrode 210 includes a first electrode stem 210S and a first electrode branch 210B, and the second electrode 220 includes a second electrode stem 220S and a second electrode branch 220B. Line Xa-Xa' of FIG. 3 is a line that extends across a first electrode stem 210S of the first subpixel PX1, line Xb-Xb' of FIG. 3 is a line that extends across first and second electrode branches 210B and 220B of the first subpixel PX1 in a first area AA1, and line Xc-Xc' of FIG. 3 is a line that extends across a second electrode stem 220 S of the first subpixel PX1. For example, portion of the first electrode 210 in an area along line Xa-Xa' of FIG. 4 may be understood as corresponding to the first electrode stem 210S of the first subpixel PX1, parts of the first and second electrodes 210 and 220 in an area along line Xb-Xb' of FIG. 4 may be understood as corresponding to the first and second electrode branches 210B and 220B of the first subpixel PX1, and portion of the second electrode 220 in an area along line Xc-Xc' of FIG. 4 may be understood as corresponding to the second electrode stem 220S of the first subpixel PX1. Here, the first electrode stem 210S and the first electrode branch 210B may form the first electrode 210, and the second electrode stem 220S and the second electrode branch 220B may form the second electrode 220.

Parts of the first and second electrodes 210 and 220 may be disposed on the via layer 200 and parts of the first and second electrodes 210 and 220 may be disposed on the inner banks (410 and 420). As described above, the first and second electrode stem parts 210S and 220S of the first and second electrodes 210 and 220 may extend in the first direction DR1, and the first and second inner banks 410 and 420 may extend in the second direction DR2 to be disposed even in the subpixels PXn that are adjacent to the first subpixel PXn in the second direction DR2. Although not specifically illustrated, the first and second electrode stem parts 210S and 220S of the first and second electrodes 210 and 220, which extend in the first direction DR1, may partially overlap with the first and second inner banks 410 and 420, respectively, but the disclosure is not limited thereto. For example, the first and second electrode stem parts 210S and 220S may not overlap with the first and second inner banks 410 and 420, respectively.

A first electrode contact hole CNDT may be formed in the first electrode stem 210S of the first electrode 210 to penetrate the via layer 200 and thus to expose portion of the first drain electrode 123 of the first transistor 120. The first electrode 210 may be electrically connected with the first drain electrode 123 through the first electrode contact hole CNTD. The first electrode 210 may be electrically connected to the first drain electrode 123 of the first transistor 120 and may thus receive electrical signals.

The second electrode stem 220S of the second electrode 220 may extend in one direction to be disposed even in the non-emission area where the light-emitting elements 300 are not disposed. A second electrode contact hole CLADS may be formed in the second electrode stem 220S to penetrate the via layer 200 and thus to expose portion of a power supply electrode 162. The second electrode 220 may be electrically connected with the power supply electrode 162 through the second electrode contact hole CNTS. The second electrode 220 may be electrically connected to the power supply electrode 162 and may thus receive electrical signals.

Parts of the first and second electrodes 210 and 220, particularly, the first and second electrode branches 210B and 220B, may be disposed on the first and second inner banks 410 and 420, respectively. The first electrode branch 210B of the first electrode 210 may be disposed to cover the first inner bank 410, and the second electrode branch 220B of the second electrode 220 may be disposed to cover the second inner bank 420. Since the first and second inner banks 410 and 420 are spaced apart from each other at the center of the first subpixel PX1, the first and second electrode branches 210B and 220B may also be spaced apart from each other. The light-emitting elements 300 may be disposed in the regions between the first and second electrodes 210 and 220, i.e., the regions where the first and second electrode branches 210B and 220B are spaced apart from, and face, each other.

The first and second electrodes 210 and 220 may include a transparent conductive material. For example, the first and second electrodes 210 and 220 may include a material such as ITO, IZO, or ITZO, but the disclosure is not limited thereto. In some embodiments, the first and second electrodes 210 and 220 may include a conductive material with a high reflectivity. For example, the first and second electrodes 210 and 220 may include a metal with a high reflectivity such as silver (Ag), copper (Cu), or aluminum (Al). In this example, light incident upon the first and second electrodes 210 and 220 can be reflected and can thus be emitted in an upward direction of the first subpixel PX1.

Each of the first and second electrodes 210 and 220 may have a structure in which one or more layers including a transparent conductive material and a metal with a high reflectivity are stacked or may include a single layer containing both a transparent conductive material and a metal with a high reflectivity. For example, each of the first and second electrodes 210 and 220 may have a stack of ITO/Ag/ITO/IZO or may include an alloy of Al, nickel (Ni), or lanthanum (La), but the present disclosure is not limited thereto.

The first insulating layer 510 is disposed on the via layer 200 and on the first and second electrodes 210 and 220. The first insulating layer 510 is disposed to partially cover the first and second electrodes 210 and 220. The first insulating layer 510 may be disposed to cover most of the top surface of each of the first and second electrodes 210 and 220, but may expose parts of the first and second electrodes 210 and 220. The first insulating layer 510 may be disposed to expose parts of the top surface of the first and second electrodes 210 and 220, for example, the top surfaces of the first and second electrode branches 210B and 220B, which are disposed on the first and second inner banks 410 and 420, respectively. For example, the first insulating layer 510 may be formed on substantially the entire via layer 220, but may include openings that expose parts of the first and second electrodes 210 and 220. The openings of the first insulating layer 510 may be disposed to expose relatively flat parts of the top surfaces of the first and second electrodes 210 and 220.

For example, the first insulating layer 510 may be stepped so that the top surface of the first insulating layer 510 may be partially recessed between the first and second electrodes 210 and 220. In some embodiments, the first insulating layer 510 may include an inorganic insulating material, and the top surface of the first insulating layer 510, which is disposed to cover the first and second electrodes 210 and 220, may be partially recessed due to height differences between the underlying elements. The light-emitting element 300, which is disposed between the first and second electrodes 210 and 220, on the first insulating layer 510, may form an empty space on the recessed portion of the top surface of the first insulating layer 510. The light-emitting element 300, which is disposed between the first and second electrodes 210 and 220, may be spaced apart, in part, from the top surface of the first insulating layer 510, and the material of a second insulating layer 520 may fill the empty space formed by the light-emitting element 300.

However, the disclosure is not limited to this. For example, the first insulating layer 510 may form a top (or a flat top) surface so that the light-emitting element 300 may be properly disposed thereon. The top surface of the first insulating layer 510 may extend in one direction toward the first and second electrodes 210 and 220 and may be terminated at the inclined sides of each of the first and second electrodes 210 and 220. For example, the first insulating layer 510 may be disposed in regions that overlap with the inclined sides of each of the first and second inner banks 410 and 420. Contact electrodes 260 may be electrically connected with exposed parts of the first and second electrodes 210 and 220 and may be in proper contact with the ends of the light-emitting element 300 on the top surface of the first insulating layer 510.

The first insulating layer 510 not only protects the first and second electrodes 210 and 220, but also insulate the first and second electrodes 210 and 220 from each other. Also, the first insulating layer 510 prevents the light-emitting element 300 disposed on the first insulating layer 510 from being damaged by being in direct contact with other elements. However, the shape and the structure of the first insulating layer 510 are not particularly limited.

The light-emitting element 300 may be disposed between the first and second electrodes 210 and 220, on the first insulating layer 510. For example, one or more light-emitting elements 300 may be disposed on the first insulating layer 510 between the first and second electrode branches 210B and 220B, but the disclosure is not limited thereto. Although not specifically illustrated, at least some of the one or more light-emitting elements 300 may be disposed in regions outside of a region between the first and second electrode branches 210B and 220B. Also, some of the one or more light-emitting elements 300 may be disposed in regions that overlap with the first and second electrodes 210 and 220. The one or more light-emitting elements 300 may be disposed in a region where the first and second electrode branches 210B and 220B face each other, and may be electrically connected to the first and second electrodes 210 and 220 via the contact electrodes 260.

As described above, light-emitting elements 300 emitting light of different wavelengths (e.g., the first, second, and third light L1, L2, and L3) may be disposed in different subpixels PXn. FIG. 4 only illustrates the first subpixel PX1 with a first light-emitting element 301 disposed therein, but the description of the first subpixel PX1 may be directly applicable to the second and third subpixels PX2 and PX3.

The light-emitting element 300 may include the layers which are arranged horizontally on the via layer 200. The light-emitting element 300 may extend in one direction and may have a structure in which the semiconductor layers are sequentially arranged in one direction. As will be described later, a first semiconductor layer 310, an active layer 330, a second semiconductor layer 320, and an electrode layer 370 may be sequentially arranged in one direction in the light-emitting element 300, and an insulating layer 380 may surround the outer surface of the stack of the first semiconductor layer 310, the active layer 330, the second semiconductor layer 320, and the electrode layer 370. The direction in which the light-emitting element 300 extends may be substantially parallel to the via layer 200, and the semiconductor layers of the light-emitting element 300 may be sequentially arranged along a direction substantially parallel to the top surface of the via layer 200. However, the disclosure is not limited to this. For example, the semiconductor layers of the light-emitting element 300 may be arranged vertically.

One end of the light-emitting element 300 may be electrically connected with a first contact electrode 261, and the other end of the light-emitting element 300 may be electrically connected with a second contact electrode 262. Since the insulating layer 380 is not formed at the ends of the light-emitting element 300 so that the ends of the light-emitting element 300 are exposed, the ends of the light-emitting elements 300 may be electrically connected with the first and second contact electrodes 261 and 262, but the disclosure is not limited thereto. For example, the insulating layer 380 may be partially removed from the light-emitting element 300 so that parts of the outer surface of the light-emitting element 300 at ends of the light-emitting element 300 may be exposed. During the fabrication of the display device 10, the insulating layer 380 may be partially removed in the process of forming the second insulating layer 520 to cover the outer surface of the light-emitting element 300. The exposed parts of the sides of the light-emitting element 300 may be electrically connected with the first and second contact electrodes 261 and 262, but the disclosure is not limited thereto.

The second insulating layer 520 may be disposed, in part, on the light-emitting element 300, which is disposed between the first and second electrodes 210 and 220. The second insulating layer 520 may be disposed to surround portion of the outer surface of the light-emitting element 300. The second insulating layer 520 not only protects the light-emitting element 300, but also fixes the light-emitting element 300 during the fabrication of the display device 10. For example, portion of the second insulating layer 520 may be disposed between the bottom surface of the light-emitting element 300 and the first insulating layer 510. As described above, the second insulating layer 520 may be formed to fill the empty space formed between the first insulating layer 510 and the light-emitting element 300 during the fabrication of the display device 10. Accordingly, the second insulating layer 520 may be formed to surround the outer surface of the light-emitting element 300. However, the disclosure is not limited to this.

In a plan view, the second insulating layer 520 may be disposed between the first and second electrode branches 210B and 220B to extend in the second direction DR2. For example, in a plan view, the second insulating layer 520 may have an island shape or a linear shape over the via layer 200. For example, in the first area AA1, the second insulating layer 520 may be disposed on the light-emitting element 300. Accordingly, the second insulating layer 520 may be disposed on the first light-emitting element 301, but not on second and third light-emitting elements 302 and 303. This will be described later in detail.

The first and second contact electrodes 261 and 262 are disposed on the first and second electrodes 210 and 220, respectively, and on the second insulating layer 520. The first and second contact electrodes 261 and 262 may be spaced apart from each other over the second insulating layer 520. The second insulating layer 520 may insulate the first and second contact electrodes 261 and 262 from each other so that the first and second contact electrodes 261 and 262 may not be in direct contact with each other.

As described above, in a plan view, the first and second contact electrodes 261 and 262 may be disposed to extend in the second direction DR2 and may be spaced apart from each other in the first direction DR1. The first and second contact electrodes 261 and 262 may be electrically connected with at least one end of the light-emitting element 300. The first and second contact electrodes 261 and 262 may be electrically connected to the first or second electrode 210 or 220 and may thus receive electrical signals.

The first contact electrode 261 may be electrically connected with the exposed portion of the first electrode 210 over the first inner bank 410, and the second contact electrode 262 may be electrically connected with the exposed portion of the second electrode 220 over the second inner bank 420. The first and second contact electrodes 261 and 262 may transmit electrical signals received from the first and second electrodes 210 and 220 to the light-emitting elements 300.

The contact electrodes 260 may include a conductive material. For example, the contact electrodes 260 may include ITO, IZO, ITZO, or Al, but the disclosure is not limited thereto.

A passivation layer 550 may be disposed on the contact electrodes 260 and on the second insulating layer 520. The passivation layer 550 may protect the elements disposed on the via layer 200 from an external environment.

The first insulating layer 510, the second insulating layer 520, and the passivation layer 550 may include an inorganic insulating material or an organic insulating material. For example, the first insulating layer 510, the second insulating layer 520, and the passivation layer 550 may include an inorganic insulating material such as silicon oxide (SiOx), silicon nitride (SiNx), silicon oxynitride (SiOxNy), aluminum oxide ($Al_2O_3$), or aluminum nitride (AlN). In another example, the first insulating layer 510, the second insulating layer 520, and the passivation layer 550 may include an organic insulating material such as an acrylic resin, an epoxy resin, a phenolic resin, a polyamide resin, a polyimide resin, an unsaturated polyester resin, a polyphenylene resin, a polyphenylene sulfide resin, benzocyclobutene, a cardo resin, a siloxane resin, a silsesquioxane resin, polymethyl methacrylate, polycarbonate, or a polymethyl methacrylate-polycarbonate synthetic resin. However, the disclosure is not limited to these examples.

The display device 10 may further include insulating layers in addition to the first insulating layer 510, the second insulating layer 520, and the passivation layer 550. For example, the display device 10 may further include, in the first subpixel PX1, a third insulating layer 530 which is disposed to protect the first contact electrode 261.

Figure 5:
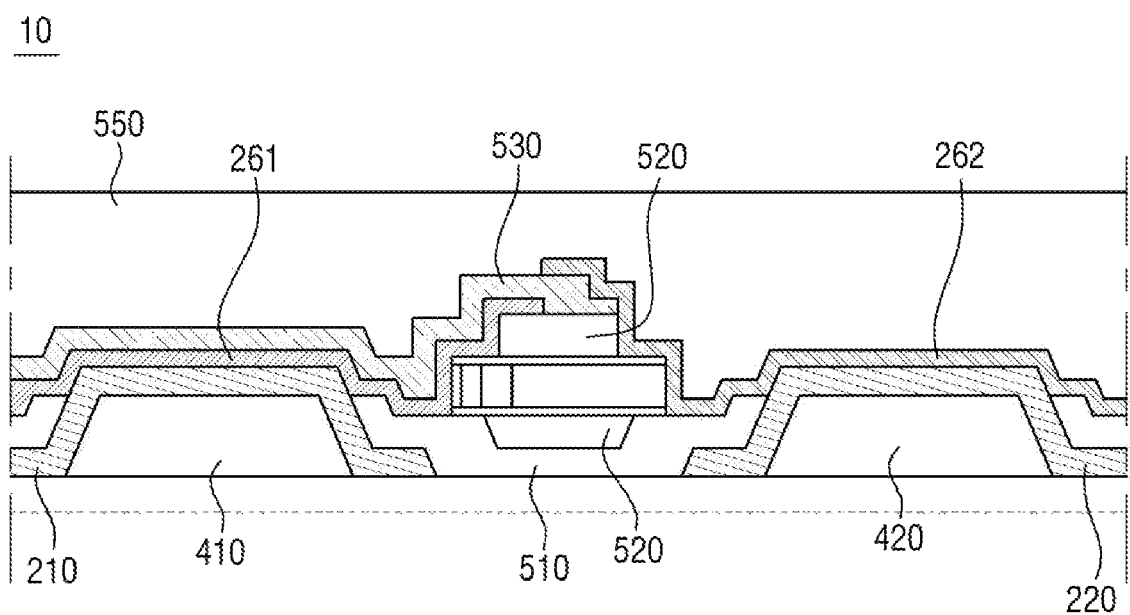
FIG. 5 is a schematic cross-sectional view of a display device according to another embodiment.

FIG. 5 is a schematic cross-sectional view of a display device according to another embodiment of the disclosure.

Referring to FIG. 5, a display device 10 may further include a third insulating layer 530 which is disposed on a first contact electrode 261. The display device 10 of FIG. 5 differs from the display device 10 of FIG. 4 in that it further includes the third insulating layer 530, and that at least portion of a second contact electrode 262 is disposed on the third insulating layer 530. The display device 10 of FIG. 5 will hereinafter be described, focusing mainly on the differences with the display device 10 of FIG. 4.

The third insulating layer 530 is disposed on the first contact electrode 261 and electrically insulates the first and second contact electrodes 261 and 262 from each other. The third insulating layer 530 may be disposed to cover the first contact electrode 261 and may not overlap with a light-emitting element 300 so that the light-emitting element 300 may be electrical connected to the second contact electrode 262. The third insulating layer 530 may electrically connected with the first contact electrode 261 and with a second insulating layer 520 over the top surface of the second insulating layer 520. The third insulating layer 530 may be disposed to cover one end of the first contact electrode 261 over the second insulating layer 520. Accordingly, the third insulating layer 530 can protect the first contact electrode 261 and can electrically insulate the first contact electrode 261 from the second contact electrode 262.

A side of the third insulating layer 530 that faces the second contact electrode 262 may be aligned with a corresponding side of the second insulating layer 520, but the disclosure is not limited thereto. In some embodiments, the third insulating layer 530, like a first insulating layer 510, may include an inorganic insulating material.

The first contact electrode 261 may be disposed between a first electrode 210 and the third insulating layer 530, and the second contact electrode 262 may be disposed on the third insulating layer 530. The second contact electrode 262 may be partially overlap with the first insulating layer 510, the second insulating layer 520, the third insulating layer 530, a second electrode 220, and the light-emitting element 300 in a plan view. An end of the second contact electrode 262 that faces the first electrode 210 may be disposed on the third insulating layer 530.

A passivation layer 550 may be disposed on the third insulating layer 530 and on the second contact electrode 262 to protect the third insulating layer 530 and the second contact electrode 262. Other elements or features of the display device 10 of FIG. 5 are almost the same as their respective counterparts of the display device 10 of FIG. 4, and thus, detailed descriptions thereof will be omitted.

Figure 6:
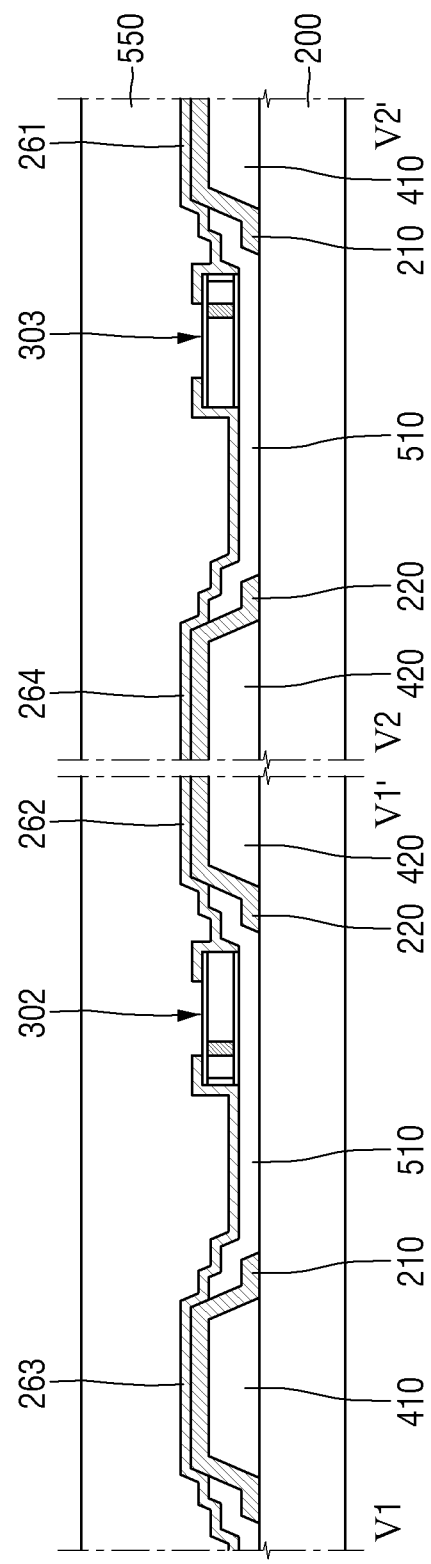
FIG. 6 is a schematic cross-sectional view taken along lines V1-V1' and V2-V2' of FIG. 3.

FIG. 6 is a schematic cross-sectional view taken along lines V1-V1' and V2-V2' of FIG. 3.

FIG. 6, illustrates light-emitting elements 300 disposed in the second area AA2, i.e., second and third light-emitting elements 302 and 303. Referring to FIG. 6, the second light-emitting element 302 may be disposed in the second area AA2, and one end of the second light-emitting element 302 may be electrically connected with the second contact electrode 262. The other end of the second light-emitting element 302 may be electrically connected with the third contact electrode 263, which is electrically connected to the first electrode 210, and may thus receive electrical signals from the first electrode 210. The third light-emitting element 303 may be disposed in the second area AA2, and one end of the third light-emitting element 303 may be electrically connected with a first contact electrode 261. The other end of the third light-emitting element 303 may be electrically connected with the fourth contact electrode 264, which is electrically connected to the second electrode 220, and may thus receive electrical signals from the second electrode 220.

The second insulating layer 520 may not be disposed on the second and third light-emitting elements 302 and 303. Since the second insulating layer 520 is disposed only on each first light-emitting element 301 in the first area AA1, the second and third light-emitting elements 302 and 303 may not be electrically connected with the second insulating layer 520. Also, the third and fourth contact electrodes 263 and 264, which are electrically connected with the second and third light-emitting elements 302 and 303, respectively, may not be electrically connected with the second insulating layer 520.

A light-emitting element 300 may be a light-emitting diode (LED), particularly, an inorganic LED having a size of several micrometers or nanometers and including an inorganic material. In response to an electric field being formed between two opposite electrodes, the inorganic LED may be aligned between the two opposite electrodes where polarity is formed. The light-emitting element 300 may be aligned between two electrodes by an electric field formed between the two electrodes.

The light-emitting element 300 may extend in one direction. The light-emitting element 300 may have the shape of a rod, a wire, or a tube. For example, the light-emitting element 300 may have a cylindrical shape or a rod shape. However, the disclosure is not limited to this example. For example, the light-emitting element 300 may have the shape of a polygonal pillar such as a cube, a cuboid, or a hexagonal pillar or may extend in one direction with portion of the outer surface thereof inclined. The semiconductors included in the light-emitting element 300 may be sequentially disposed or stacked in one direction.

The light-emitting element 300 may include a semiconductor layer doped with impurities of an arbitrary conductivity type (e.g., a p type or an n type). The semiconductor layer may receive electrical signals from an external power source and may thus emit light of a wavelength range.

Figure 7:
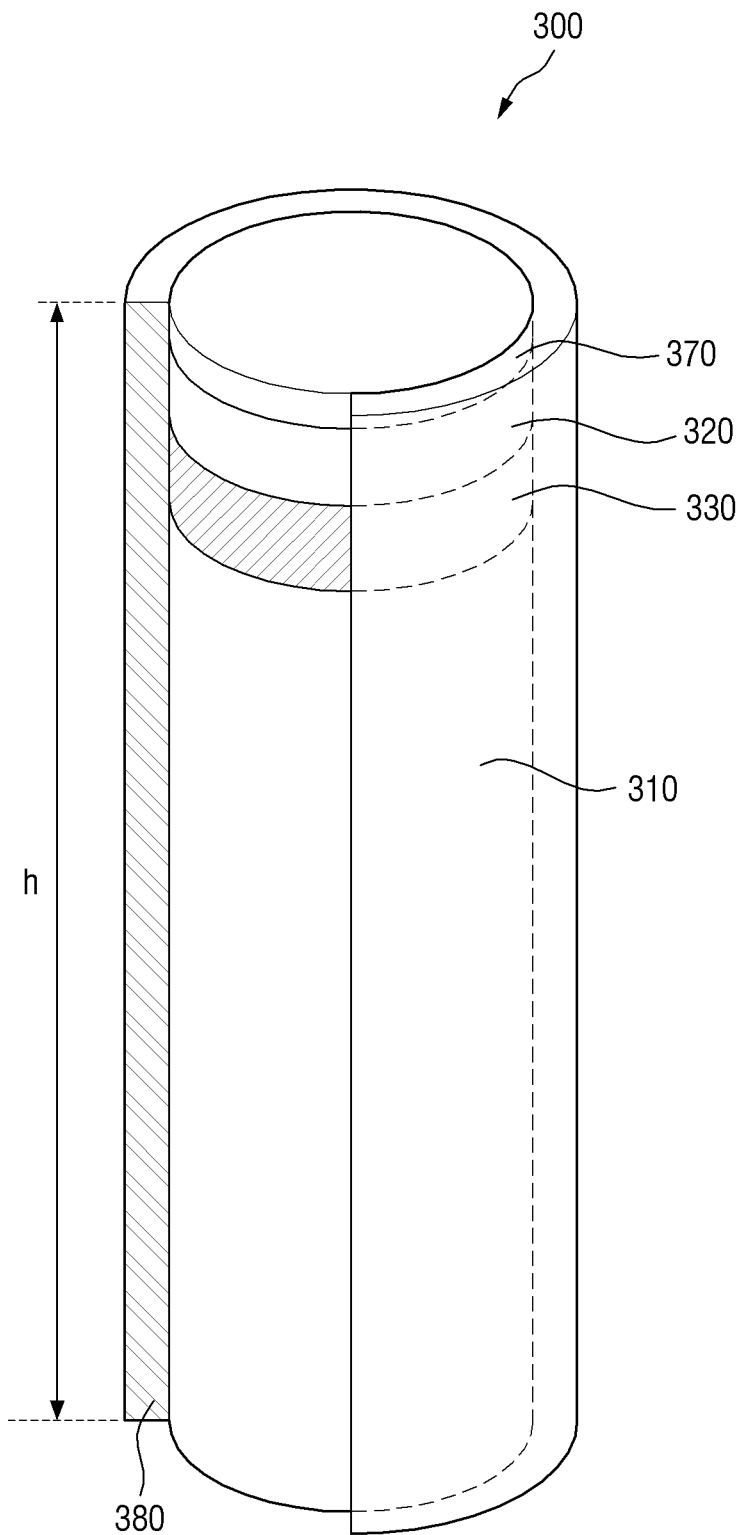
FIG. 7 is a schematic perspective view illustrating a light-emitting element according to an embodiment.

FIG. 7 is a schematic perspective view illustrating a light-emitting element according to an embodiment of the disclosure.

Referring to FIG. 7, a light-emitting element 300 may emit light of a wavelength range. For example, an active layer 330 may emit blue light having a central wavelength range of about 450 nm to about 495 nm. However, the central wavelength range of the blue light is not particularly limited, but needs to be understood as encompassing nearly all wavelengths that can be perceived as blue light. In another example, the active layer 330 may emit green light having a central wavelength range of about 495 nm to about 570 nm or red light having a central wavelength range of about 620 nm to about 750 nm. The light-emitting element 300 will hereinafter be described as emitting, for example, blue light.

The light-emitting element 300 may include a first semiconductor layer 310, a second semiconductor layer 320, the active layer 330, an electrode layer 370, and an insulating layer 380.

The first semiconductor layer 310 may include a semiconductor of a first conductivity type, for example, an n-type semiconductor. For example, in a case where the light-emitting element 300 emits blue light, the first semiconductor layer 310 may include a semiconductor material having the following chemical formula: $Al_xGa_yIn_{1-x-y}N$ where $0 \leq x \leq 1$, $0 \leq y \leq 1$, and $0 \leq x+y \leq 1$. For example, the first semiconductor layer 310 may include at least one of AlGaInN, GaN, AlGaN, InGaN, AlN, and InN, doped with n-type impurities. The first semiconductor layer 310 may be doped with a dopant of the first conductivity type. For example, the dopant of the first conductivity type may be Si, Ge, or Sn. For example, the first semiconductor layer 310 may be n-GaN doped with n-type Si. The first semiconductor layer 310 may have a length of about 1.5 μm to about 5 μm, but the disclosure is not limited thereto.

The second semiconductor layer 320 is disposed on the active layer 330. The second semiconductor layer 320 may include a semiconductor of a second conductivity type, for example, a p-type semiconductor. For example, in a case where the light-emitting element 300 emits blue light or green light, the second semiconductor layer 320 may include a semiconductor material having the following chemical formula: $Al_xGa_yIn_{1-x-y}N$ where $0 \leq x \leq 1$, $0 \leq y \leq 1$, and $0 \leq x+y \leq 1$). For example, the second semiconductor layer 320 may include at least one of AlGaInN, GaN, AlGaN, InGaN, AlN, and InN, doped with p-type impurities. The second semiconductor layer 320 may be doped with a dopant of the second conductivity type. For example, the dopant of the second conductivity type may be Mg, Zn, Ca, Se, or Ba. For example, the second semiconductor layer 320 may be p-GaN doped with p-type Mg. The second semiconductor layer 320 may have a length of about 0.05 μm to about 0.10 μm, but the disclosure is not limited thereto.

Each of the first and second semiconductor layers 310 and 320 is illustrated as being a single layer, but the disclosure is not limited thereto. In some embodiments, each of the first and second semiconductor layers 310 and 320 may further include, for example, a clad layer or a tensile strain barrier-reducing (TSBR) layer depending on the material of the active layer 330. This will be described later in detail.

The active layer 330 is disposed between the first and second semiconductor layers 310 and 320. The active layer 330 may include a single- or multi-quantum well structure material. In a case where the active layer 330 includes a material having a multi-quantum well structure, the active layer 330 may have a multilayer structure in which quantum layers and well layers are alternately stacked. The active layer 330 may emit light by combining electron-hole pairs in accordance with electrical signals applied via the first and second semiconductor layers 310 and 320. For example, in a case where the active layer 330 emits blue light, the active layer 330 may include a material such as AlGaN or AlGaInN. Specifically, in a case where the active layer 330 has a multi-quantum well structure in which quantum layers and well layers are alternately stacked, the quantum layers may include a material such as AlGaN or AlGaInN, and the well layers may include a material such as GaN or AlInN. For example, the quantum layers of the active layer 330 may include AlGaInN, and the well layers of the active layer 330 may include AlInN. Accordingly, the active layer 330 may emit blue light having a central wavelength range of about 450 nm to about 495 nm.

However, the disclosure is not limited to this. For example, the active layer 330 may have a structure in which a semiconductor material having a large bandgap energy and a semiconductor material having a small bandgap energy are alternately stacked and may include a group III or V semiconductor material depending on the wavelength of light to be emitted therefrom. The wavelength of light emitted by the active layer 330 is not limited, and the active layer 330 may emit red light or green light. The active layer 330 may have a length of about 0.05 μm to about 0.10 μm, but the disclosure is not limited thereto.

The active layer 330 may emit light not only in the direction of the length of the light-emitting element 300, but also in the directions of sides of the light-emitting element 300. The directivity of light emitted by the active layer 330 is not particularly limited.

The electrode layer 370 may be an ohmic contact electrode, but the disclosure is not limited thereto. For example, the electrode layer 370 may be a Schottky contact electrode. The light-emitting element 300 may include at least one electrode layer 370. FIG. 7 illustrates that the light-emitting element 300 includes a single electrode layer 370, but the disclosure is not limited thereto. The light-emitting element 300 may include more than one electrode layer 370, or the electrode layer 370 may not be provided. The description of the light-emitting element 300 may directly apply to a case where the light-emitting element 300 includes more than one electrode layer 370 or has a structure other than that set forth herein.

The electrode layer 370 can reduce the resistance between the light-emitting element 300 and an electrode (or a contact electrode) when the light-emitting element 300 is electrically connected to the electrode (or the contact electrode). The electrode layer 370 may include a conductive metal. For example, the electrode layer 370 may include at least one of Al, Ti, In, Au, Ag, ITO, IZO, and ITZO. The electrode layer 370 may include a semiconductor material doped with n- or p-type impurities. The electrode layer 370 may include the same material or different materials, but the disclosure is not limited thereto.

The insulating layer 380 is disposed to surround the outer surfaces of the first semiconductor layer 310, the second semiconductor layer 320, the active layer 330, and the electrode layer 370. For example, the insulating layer 380 may be disposed to surround at least the outer surface of the active layer 330 and may extend in the same direction as the light-emitting element 300. The insulating layer 380 may protect the first semiconductor layer 310, the second semiconductor layer 320, the active layer 330, and the electrode layer 370. For example, the insulating layer 380 may be formed to surround the outer surfaces of the first semiconductor layer 310, the second semiconductor layer 320, the active layer 330, and the electrode layer 370, but to expose ends of the light-emitting elements 300 in the direction of the length of the light-emitting element 300.

The insulating layer 380 may be illustrated as extending in the direction of the length of the light-emitting element 300 to cover the sides of each of the first semiconductor layer 310, the second semiconductor layer 320, the active layer 330, and the electrode layer 370, but the disclosure is not limited thereto. For example, the insulating layer 380 may cover the outer surface of the active layer 330 and the outer surfaces of only some of the first semiconductor layer 310, the second semiconductor layer 320, and the electrode layer 370, or may cover only portion of the outer surface of the electrode layer 370 to expose the rest of the outer surface of the electrode layer 370. The insulating layer 380 may be formed to have a round top surface in an area adjacent to at least one end of the light-emitting element 300.

The insulating layer 380 may have a thickness of about 10 nm to about 1.0 μm, but the disclosure is not limited thereto. For example, the insulating layer 380 may have a thickness of about 40 nm.

The insulating layer 380 may include an insulating material such as, for example, silicon oxide ($SiO_x$), silicon nitride ($SiN_x$), silicon oxynitride ($SiO_xN_y$), aluminum nitride (AlN), or aluminum oxide ($Al_2O_3$). Accordingly, an electrical short circuit that may occur when the active layer 330 is in direct contact with an electrode transmitting electrical signals to the light-emitting element 300 can be prevented. Also, since the insulating layer 380 protects the outer surface of the light-emitting element 300 including the active layer 330, a decrease in the emission efficiency of the light-emitting element 300 can be prevented.

In some embodiments, the insulating layer 380 may be surface treated. The light-emitting element 300 may be aligned by being sprayed onto an electrode while being dispersed in an ink during the fabrication of a display device 10. Here, for the light-emitting element 300 to remain dispersed in the ink without coagulating with other light-emitting elements 300, the surface of the insulating layer 380 may be hydrophobically or hydrophilically treated.

The light-emitting element 300 may have a length h in a range of about 1 μm to about 10 μm, a range of about 2 μm to about 6 μm, or a range of about 3 μm to about 5 μm. The light-emitting element 300 may have a diameter of about 300 nm to about 700 nm and may have an aspect ratio of 1.2 to 100, but the disclosure is not limited thereto. For example, the diameter of the light-emitting element 300 may vary depending on the composition of the active layer 330. For example, the light-emitting element 300 may have a diameter of about 500 nm.

Display devices according to other embodiments of the disclosure will hereinafter be described.

The structures and the numbers of contact electrodes (261, 262, 263, and 264) and electrodes (210 and 220) of the display device 10 are not particularly limited, but may vary.

Figure 8:
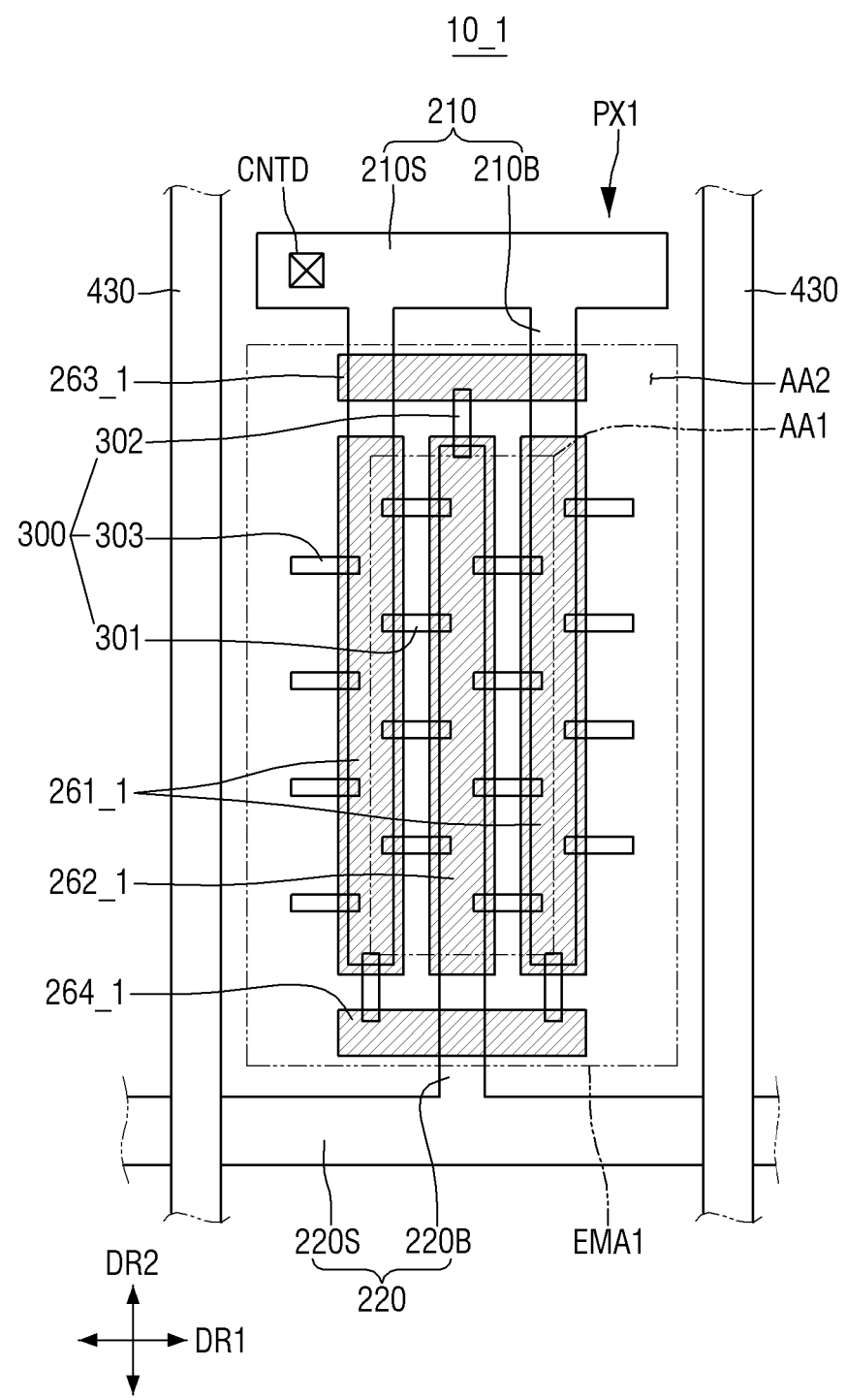
FIGS. 8 through 10 are plan views illustrating sub-pixels of display devices according to other embodiments.
Figure 9:
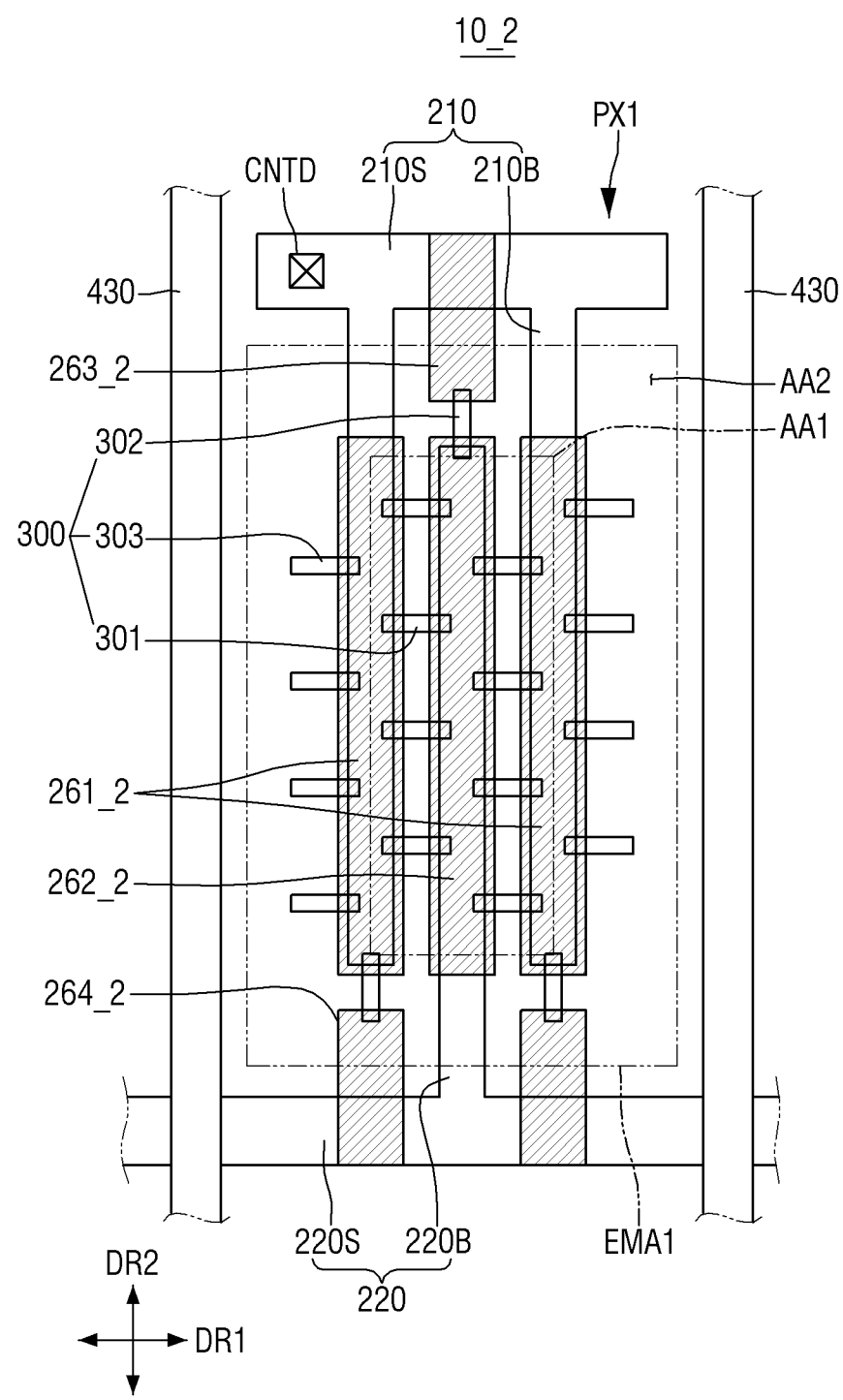
Figure 10:
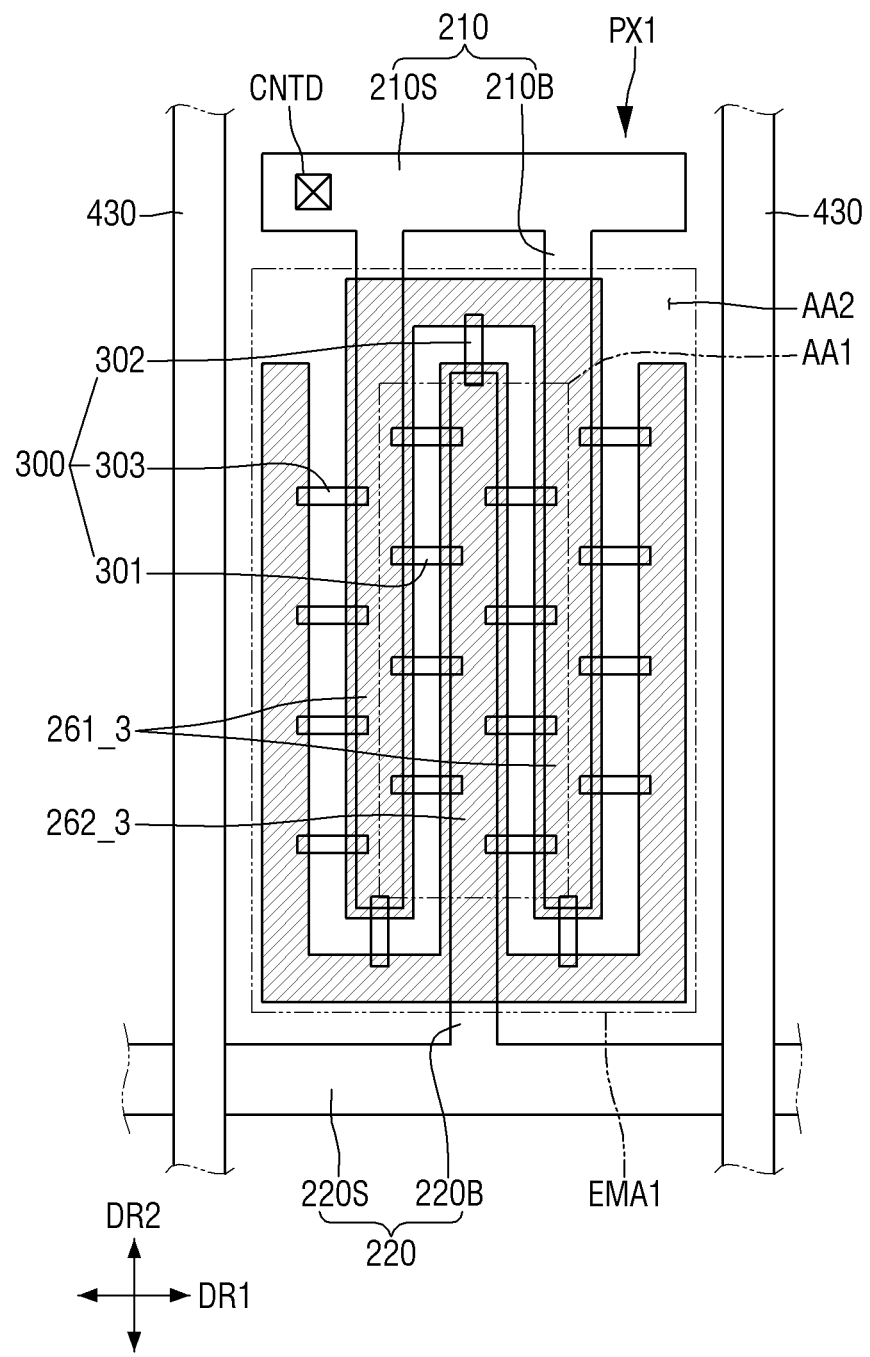

FIGS. 8 through 10 are plan views illustrating sub-pixels of display devices according to other embodiments of the disclosure.

Referring to FIG. 8, a display device 10_1 may include, in a first subpixel PX1, third and fourth contact electrodes 263_1 and 264_1 which extend in a first direction DR1. The display device 10_1 of FIG. 8 differs from the display device 10 of FIG. 1 in that the fourth contact electrode 264_1 does not include a second portion that extends in a second direction DR2, and that the third and fourth contact electrodes 263_1 and 264_1 only include first parts that extend in the first direction DR1. The display device 10_1 of FIG. 8 will hereinafter be described, focusing mainly on the differences with the display device 10 of FIG. 3.

The third and fourth contact electrodes 263_1 and 264_1 may extend in the first direction DR1 and may be electrically connected with light-emitting elements 300 disposed in a second area AA2. The third contact electrode 263_1 may be electrically connected with first electrode branches 210B, and the fourth contact electrode 264_1 may be electrically connected with a second electrode branch 220B. Accordingly, among the light-emitting elements 300 disposed in the second area AA2, light-emitting elements 300 extending in the second direction DR2 may be electrically connected to first and second electrodes 210 and 220, whereas light-emitting elements 300 extending in the first direction DR1 may not be electrically connected to the first and second electrodes 210 and 220.

In some embodiments, the display device 10_1 may include more subpixels PXn in a given unit area than the display device 10 of FIG. 3, and as a result, the area of subpixels PXn of the display device 10_1 may become smaller than the area of subpixels PXn of the display device 10 of FIG. 3. For example, the width, in the first or second direction DR1 or DR2, of the first subpixel PX1 of FIG. 8 may become smaller than the width, in the first or second direction DR1 or DR2, of the first subpixel PX1 of FIG. 3. The area in which the third and fourth contact electrodes 263_1 and 264_1 for electrically connecting a second light-emitting element 302 and third light-emitting elements 303, disposed in the second area AA2, to the first and second electrodes 210 and 220, can be disposed may become smaller. Thus, the third and fourth contact electrodes 263_1 and 264_1 may be formed to include only the first parts that extend in the first direction DR1.

Since the fourth contact electrode 264_1 does not include a second portion that extends in the second direction DR2, the width, in the first direction DR1, of the first subpixel PX1 of FIG. 8 may be smaller than the width, in the first direction DR1, of the first subpixel PX1 of FIG. 3. The third and fourth contact electrodes 263_1 and 264_1, which extend in the first direction DR1, may be in contact with the light-emitting elements 300 extending in the second direction DR2. Also, the third and fourth contact electrodes 263_1 and 264_1 may be electrically connected with the first branch electrode parts 210B and with the second branch electrode 220B and may thus electrically connect the light-emitting elements 300 extending in the second direction DR2 to the first and second electrodes 210 and 220.

Referring to FIG. 9, a display device 10_2 may include, in a first subpixel PX1, a third contact electrode 263_2 and fourth contact electrodes 264_2 which extend in a second direction DR2. The display device 10_2 of FIG. 9 differs from the display device 10_1 of FIG. 8 in that the third contact electrode 263_2 and the fourth contact electrodes 264_2 only include second parts that extend in the second direction DR2. The display device 10_2 of FIG. 9 will hereinafter be described, focusing mainly on the differences with the display device 10_1 of FIG. 8.

The third contact electrode 263_2 and the fourth contact electrodes 264_2 may extend in the second direction DR2 and may be electrically connected with light-emitting elements 300 disposed in a second area AA2. The third contact electrode 263_2 may be electrically connected with a first electrode stem 210S, and the fourth contact electrodes 264_2 may be electrically connected with a second electrode stem 220S. FIG. 9 illustrates that one third contact electrode 263_2 and two fourth contact electrodes 264_2 is disposed, but the disclosure is not limited thereto. The third contact electrode 263_2 may be disposed on the same line as, and spaced apart from, a second contact electrode 262_2, and the fourth contact electrodes 264_2 may be disposed on the same lines as, and spaced apart from, first contact electrodes 261_2. A second light-emitting element 302 may be disposed between the second and third contact electrodes 262_2 and 263_2, and third light-emitting elements 303 may be disposed between the first contact electrodes 261_2 and the fourth contact electrodes 264_2. The display device 10_2 of FIG. 9 is the same as the display device 10_1 of FIG. 8 except for the shapes of the third contact electrode 263_2 and the fourth contact electrodes 264_2, and thus, a further detailed description thereof will be omitted.

Referring to FIG. 10, a display device 10_3 may include, in a first subpixel PX1, a first contact electrode 261_3 into which the first contact electrodes 261 and the third contact electrode 263 of FIG. 3 are combined, and a second contact electrode 262_2 into which the second and fourth contact electrodes 262 and 264 of FIG. 3 are combined. The display device 10_3 of FIG. 10 differs from the display device 10 of FIG. 1 at least in an aspect that the first contact electrode 261 and the third contact electrode 263 of FIG. 3 may be combined into (or integrated with) the first contact electrode 261_3, and that the second contact electrode 262 and the fourth contact electrode 264 of FIG. 3 may be combined into (or integrated with) the second contact electrode 262_3. The display device 10_3 of FIG. 10 will hereinafter be described, focusing mainly on the differences with the display device 10 of FIG. 3.

As described above with reference to FIG. 3, the third contact electrode 263 may be electrically connected with the first electrode 210, and the fourth contact electrode 264 may be electrically connected with the second electrode 220. Accordingly, the second light-emitting element 302, which is electrically connected with the third contact electrode 263, and the third light-emitting elements 303, which are electrically connected with the fourth contact electrode 264, can be electrically connected to the first and second electrodes 210 and 220. For example, the shapes of the third and fourth contact electrodes 263 and 264 may vary as long as the second light-emitting element 302 and the third light-emitting elements 303 can be electrically connected to the first and second electrodes 210 and 220. In some embodiments, the third and fourth contact electrodes 263 and 264 may be electrically connected to the first contact electrode 261 and the second contact electrodes 262.

Referring to FIG. 10, the first contact electrode 261_3 may include a first portion that extends in a first direction DR1 and second parts that extend in a second direction DR2. The second contact electrode 262_3 may include a first portion that extends in a first direction DR1 and second parts that extend in a second direction DR2. The second parts of the first and second contact electrodes 261_3 and 262_3 may be spaced apart from, and face, each other. Even if the second parts of the first contact electrode 261_3 are disposed on first electrode branches 210B, at least a portion of the first portion of the first contact electrode 261_3 may be disposed on a first insulating layer 510 (of FIG. 4) not to overlap with first and second electrodes 210 and 220. Some of the second parts of the second contact electrode 262_3 may be disposed on the second electrode 220, and other second parts of the second contact electrode 262_3 may be disposed on the first insulating layer 510 not to overlap with the first and second electrodes 210 and 220. At least of the first portion of the second contact electrode 262_3 may overlap with a second electrode branch 220B and may be disposed on the first insulating layer 510.

Since the first contact electrode 261 and the third contact electrode 263 of FIG. 3 are combined into the first contact electrode 261_3 and the second contact electrode 262 and the fourth contact electrode 264 of FIG. 3 are combined into the second contact electrode 262_3, the first and second contact electrodes 261_3 and 262_3 may be electrically connected with the first and second electrodes 210 and 220 in regions that overlap with the first and second electrodes 210 and 220. For example, the first and second contact electrodes 261_3 and 262_3 may be electrically connected with the first and second electrodes 210 and 220, respectively, in a first area AA1. Even if the first and second contact electrodes 261_3 and 262_3 are electrically connected with the first and second electrodes 210 and 220, respectively, only in the first area AA1, light-emitting elements 300 disposed in a second area AA2, i.e., a second light-emitting element 302 and third light-emitting elements 303, can be electrically connected to the first and second electrodes 210 and 220 because the first and second contact electrodes 261_3 and 262_3 are disposed even in the second area AA2.

The structures of the first and second electrodes 210 and 220 of FIG. 3 are not particularly limited. For example, some of the electrode branches (210B and 220B) of FIG. 3 may not be provided, or each of the first and second electrodes 210 and 220 of FIG. 3 may include more electrode branches than illustrated in FIG. 3.

Figure 11:
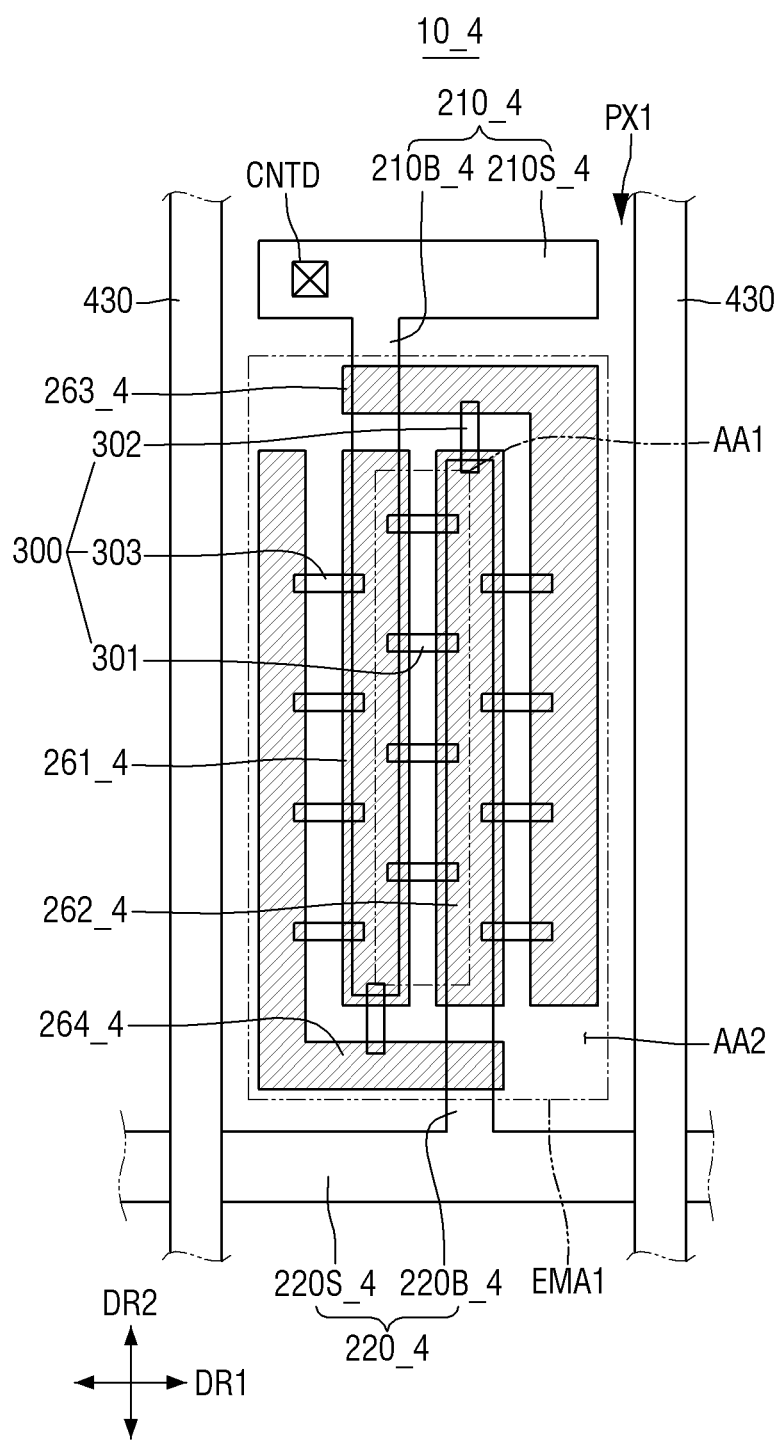
FIGS. 11 and 12 are plan views illustrating sub-pixels of display devices according to other embodiments.
Figure 12:
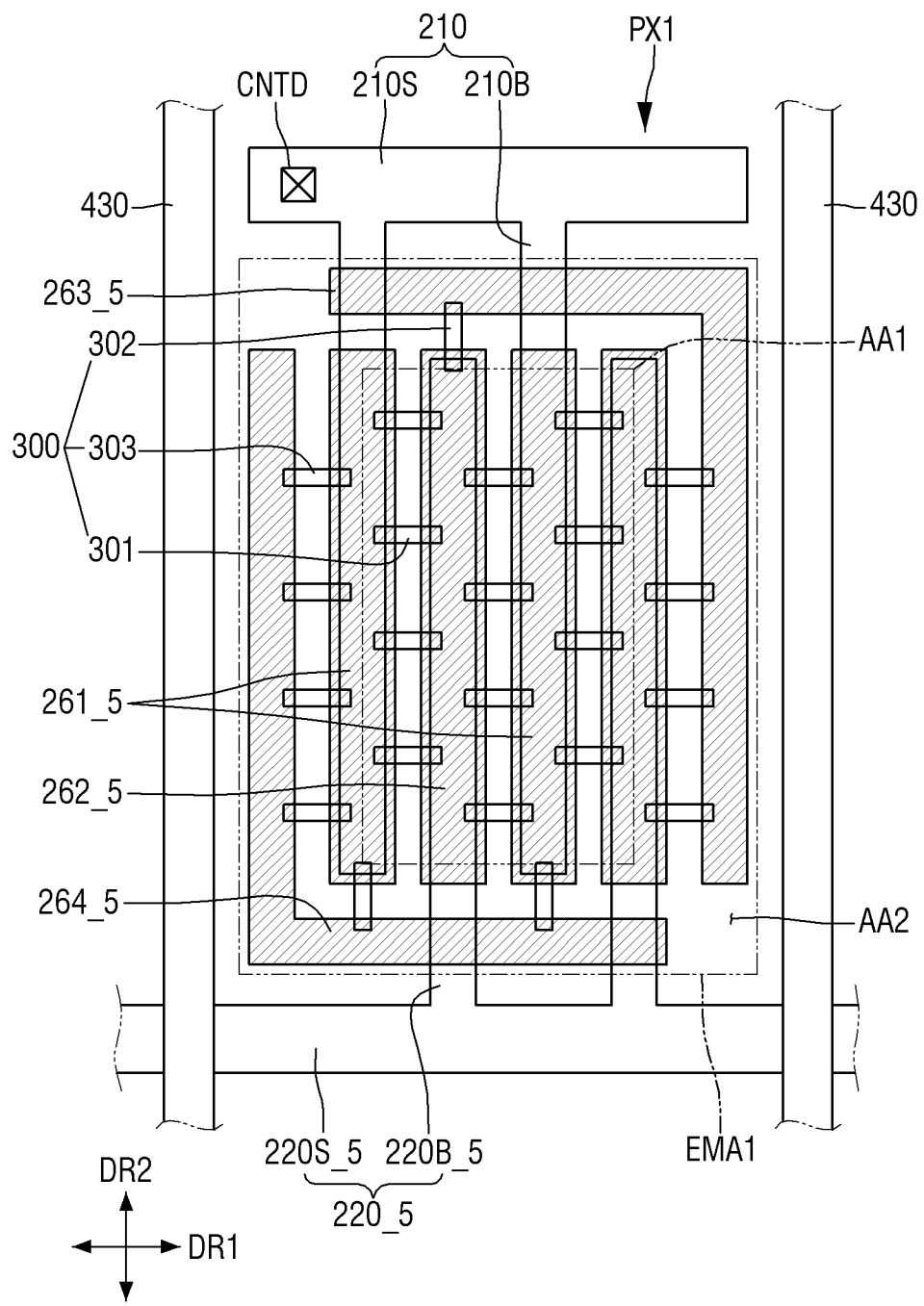

FIGS. 11 and 12 are plan views illustrating sub-pixels of display devices according to other embodiments of the disclosure.

Referring to FIG. 11, a display device 10_4 may include, in a first subpixel PX1, a first electrode 210_4 and a second electrode 220_4, the first electrode 210_4 may include only one electrode branch 210B_4, and the second electrode 220_4 may include only one second electrode branch 220B_4. The display device 10_4 of FIG. 11 differs from the display device 10 of FIG. 3 in that only one first electrode branch 210B_4 is provided in the first electrode 210. The display device 10_1 of FIG. 8 will hereinafter be described, focusing mainly on the differences with the display device 10 of FIG. 3.

Since only one first electrode branch 210B_4 is provided in the first electrode 210, the width, in a first direction DR1, of the first subpixel PX1 may become smaller. As described above with reference to FIG. 8, the greater the number of subpixels PXn in each unit area, the smaller the width of subpixels PXn. Since the first electrode 210_4 includes only one first electrode branch 210B_4, the width of subpixels PXn can be minimized.

The size of a first area AA1 of FIG. 11 where the first and second electrode branches 210B_4 and 220B_4 face each other may be smaller than the size of the first area AA1 of FIG. 3. For example, the number of first light-emitting elements 301 disposed in the first area AA1 may slightly decrease, but a sufficient emission rate can be secured by electrically connecting a second light-emitting element 302 and third light-emitting elements 303 disposed in a second area AA2 to the first and second electrodes 210_4 and 220_4.

Each of third and fourth contact electrodes 263_4 and 264_4 may include a first portion that extends in the first direction DR1 and a second portion that extends in a second direction DR2. The first parts of the third and fourth contact electrodes 263_4 and 264_4 may overlap with the first and second electrode branches 210B_4 and 220B_4, respectively, and may be electrically connected with each other.

The second portion of the third contact electrode 263_4 that extends in the second direction DR2 may be spaced apart from, and face, a second contact electrode 262_4, and the second light-emitting element 302 may be disposed between the second portion of the third contact electrode 263_4 and the second contact electrode 262_4. One end of the second light-emitting element 302 may be electrically connected with the second contact electrode 262_4, and the other end of the second light-emitting element 302 may be electrically connected with the third contact electrode 263_4. The second portion of the fourth contact electrode 264_4 that extends in the second direction DR2 may be spaced apart from, and face, a first contact electrode 261_4, and the third light-emitting elements 303 may be disposed between the second portion of the fourth contact electrode 264_4 and the first contact electrode 261_4. One end of each of the third light-emitting elements 301 may be electrically connected with the first contact electrode 261_4, and the other end of each of the third light-emitting elements 303 may be electrically connected with the fourth contact electrode 264_4.

The first portion of the third contact electrode 263_4 that extends in the first direction DR1 may partially be spaced apart from, and face, the second contact electrode 262_4, and the second light-emitting element 302 may be disposed between the first portion of the third contact electrode 263_4 and the second contact electrode 262_4. The first portion of the fourth contact electrode 264_4 that extends in the first direction DR1 may partially be spaced apart from, and face, the first contact electrode 261_4, and the third light-emitting elements 303 may be disposed between the first portion of the fourth contact electrode 264_4 and the first contact electrode 261_4. Other elements or features of the display device 10_4 is almost the same as their respective counterparts of the display device 10 of FIG. 3, and thus, descriptions thereof will be omitted.

Referring to FIG. 12, a display device 10_5 may include, in a first subpixel PX1, first and second electrodes 210_5 and 220_5, the first electrode 210_5 may include two first electrode branches 210B_5, and the second electrode 220_5 may include two second electrode branches 220B_5. The display device 10_5 of FIG. 12 may be substantially the same as the display device 10_4 of FIG. 11, except for the numbers of first electrode branches 210B_5 and second electrode branches 220B_5. For example, each of third and fourth contact electrodes 263_5 and 264_5 may include a first portion that extends in a first direction DR1 and a second portion that extends in a second direction DR2. A further detailed description of the display device 10_5 of FIG. 12 will be omitted.

As mentioned above, in some embodiments, the first and second electrode stem parts 210S and 220S of FIG. 3 may not be provided.

Figure 13:
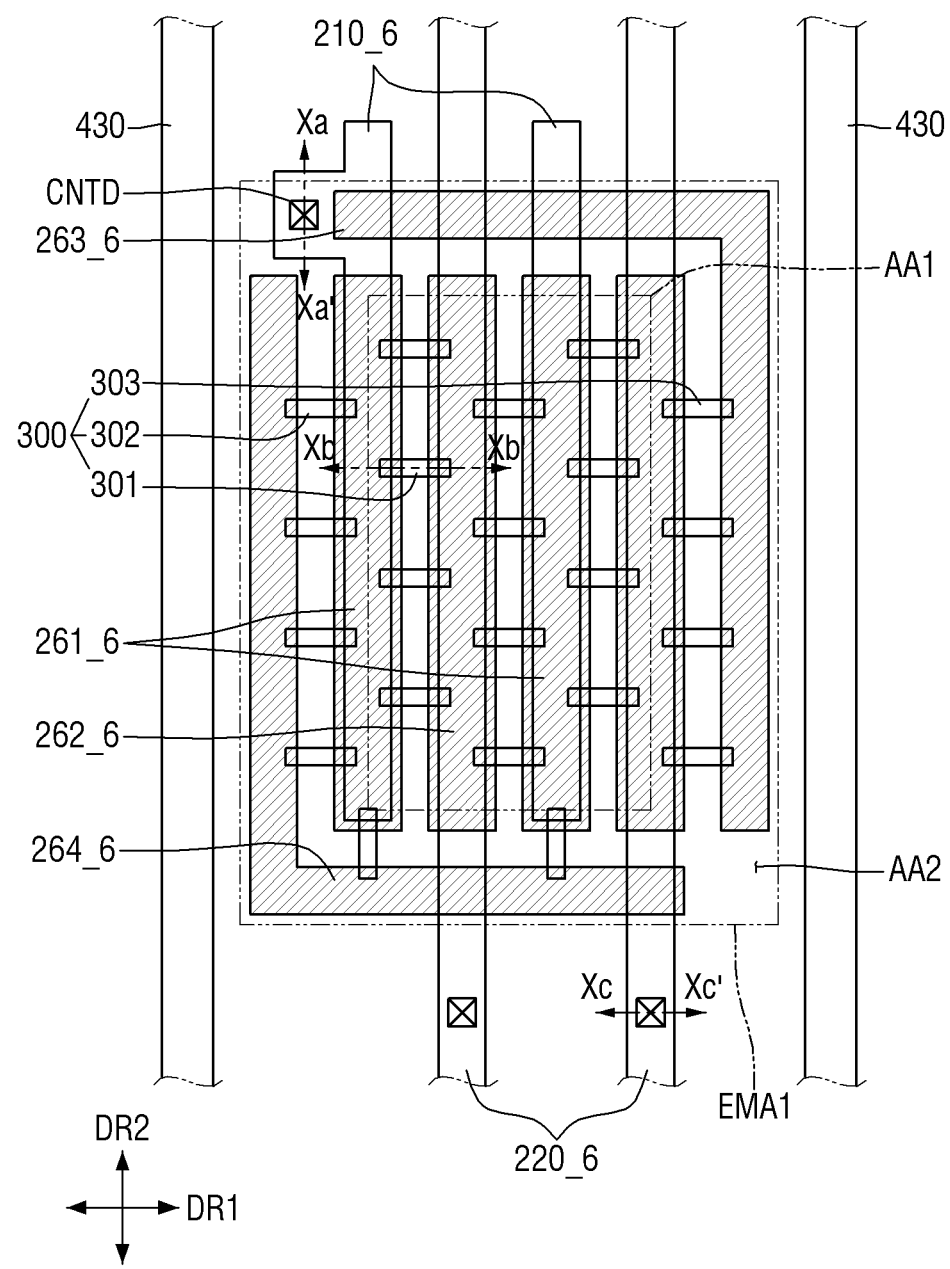
FIGS. 13 and 14 are plan views illustrating sub-pixels of display devices according to other embodiments.
Figure 14:
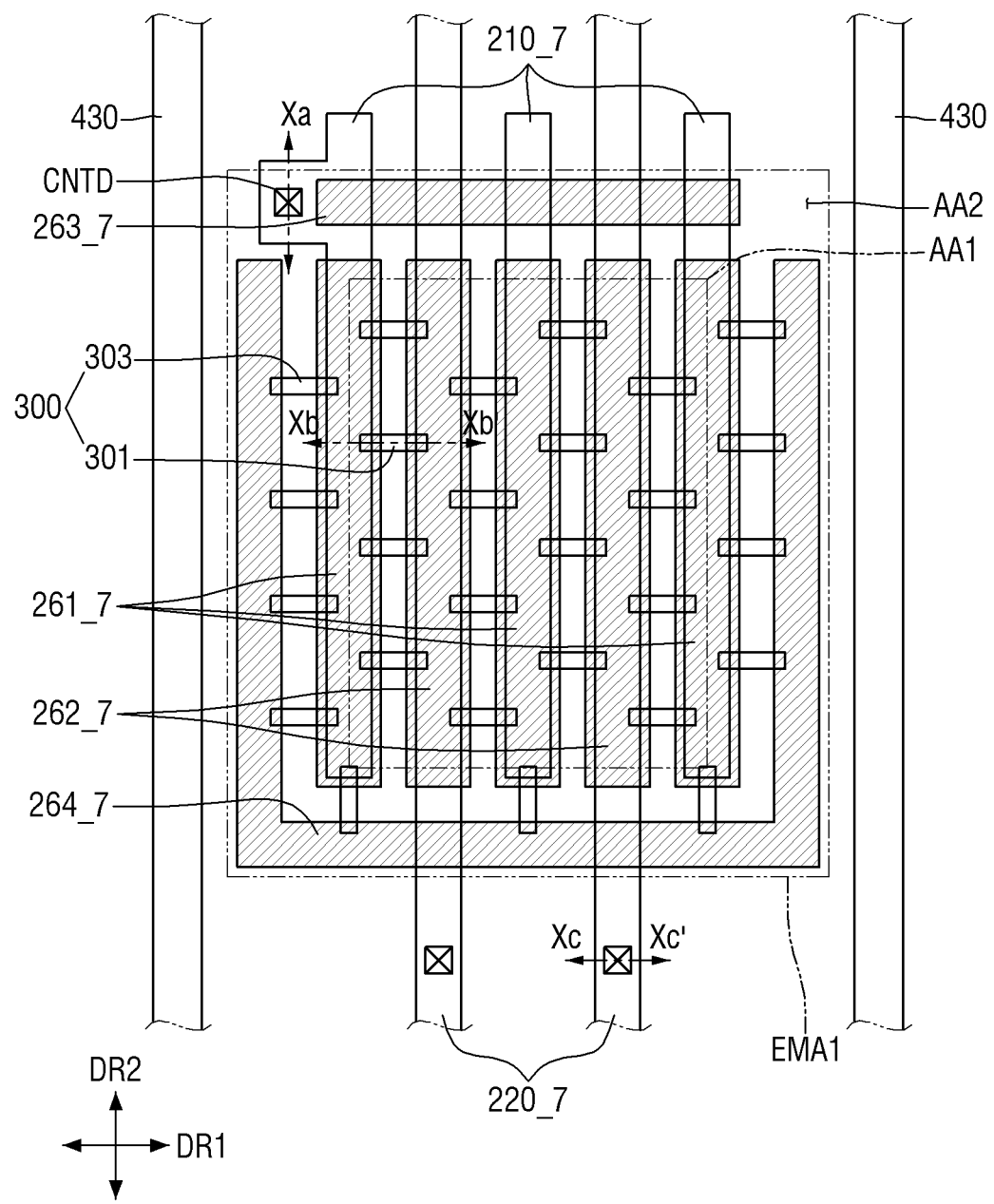

FIGS. 13 and 14 are plan views illustrating sub-pixels of display devices according to other embodiments of the disclosure.

Referring to FIGS. 13 and 14, a display device 10_6 or 10_7 may include, in a first subpixel PX1, first electrodes 210_6 or 210_7 and second electrodes 220_6 and 220_7, and the first electrodes 210_6 or 210_7 and the second electrodes 220_6 and 220_7 may extend in one direction, for example, in a second direction DR2. No electrode stem parts may be provided in the first electrodes 210_6 or 210_7 and in the second electrodes 220_6 and 220_7. The display device 10_6 of FIG. 13 differs from the display device 10_5 of FIG. 12 in that no electrode stem parts are provided in the first electrodes 210_6 and in the second electrodes 220_6. The display device 10_7 of FIG. 14 differs from the display device 10_6 of FIG. 13 in the number of first electrodes 210_7. A schematic cross-sectional view, taken long lines Xa-Xa', Xb-Xb', and Xc-Xc' of FIG. 14, of the display device 10_7 of FIG. 14 may be the same as illustrated in FIG. 4. The display device 10_6 of FIG. 13 will hereinafter be described, focusing mainly on the differences with the display device 10_5 of FIG. 12, and the display device 10_7 of FIG. 14 will hereinafter be described, focusing mainly on the differences with the display device 10_6 of FIG. 13.

Referring to FIG. 13, the first electrodes 210_6 and the second electrodes 220_6 may be provided in a first subpixel PX1 to extend in the second direction DR2. Outer banks 430 may also extend in the second direction DR2. The second electrodes 220_6 and the outer banks 430 may extend even to subpixels PXn that are adjacent to the first subpixel PX1 in the second direction DR2. Accordingly, the subpixels PXn that are adjacent to the first subpixel PX1 in the second direction DR2 can receive the same electrical signals from the second electrodes 220_6.

In the embodiment of FIG. 13, unlike in the embodiment of FIG. 3, a second electrode contact hole CNTS may be disposed in each of the second electrodes 220_6. The second electrodes 220_6 may be electrically connected to a power supply electrode 162 of a circuit element layer PAL via the second electrode contact holes CNTS.

The first electrodes 210_6 may extend in the second direction DR2 and may be terminated at the boundaries between the first subpixel PX1 and other subpixels PXn. The first subpixel PX1 and the subpixels PXn that are adjacent to the first subpixel PX1 in the second direction DR2 may each include first electrodes 210_6 which are spaced apart from one another and may thus receive different electrical signals via contact holes CNTD of the first electrodes 210_6. The first electrodes 210_6 of FIG. 13 may be obtained by disconnecting the first electrode 210_6 of FIG. 3 at the boundaries between the first subpixel PX1 and the subpixels PXn that are adjacent to the first subpixel PX1 in the second direction DR2.

The outer banks 430 may be disposed at the boundaries between the first subpixel PX1 and subpixels PXn that are adjacent to the first subpixel PX1 in the first direction DR1, to extend in the second direction DR2. For example, although not specifically illustrated, the outer banks 430 may be disposed at the boundaries between the first subpixel PX1 and the subpixels PXn that are adjacent to the first subpixel PX1 in the second direction DR2, to extend in the first direction DR1. The outer banks 430 are the same as described above with reference to FIG. 3.

First contact electrodes 261_6, second contact electrodes 262_6, a third contact electrode 263_6, and a fourth contact electrodes 264_6 of FIG. 13 are substantially the same as their respective counterparts of FIG. 12. Since the second electrodes 220_6 extend even to the subpixels PXn that are adjacent to the first subpixel PX1 in the second direction DR2, the third contact electrode 263_6 may partially overlap with the second electrodes 220_6. In regions where the third contact electrode 263_6 and the second electrodes 220_6 overlap, a first insulating layer 510 may be disposed so that the third contact electrode 263_6 may not be electrically connected with the second electrodes 220_6.

FIG. 13 illustrates that two first electrodes 210_6 and two second electrodes 220_6 is alternately disposed to be spaced apart from one another, but the disclosure is not limited thereto. Some of the first electrodes 210_6 and of the second electrodes 220_6 may not be provided, or more than two first electrodes 210_6 and more than two second electrodes 220_6 may be provided.

Referring to FIG. 14, the display device 10_7 may include, in a first subpixel PX1, three first electrodes 210_7 and two second electrodes 220_7, and the first electrodes 210_7 and the second electrodes 220_7 may extend in a second direction DR2. The display device 10_7 of FIG. 14 differs from the display device 10_6 of FIG. 13 in that three first electrodes 210_7, rather than two first electrodes 210_7, are provided in each subpixel PXn. Accordingly, a third contact electrode 263_7 may include only a first portion that extends in a first direction DR1, and a fourth contact electrode 264_7 may include a first portion that extends in the first direction DR1 and a second portion that extends in a second direction DR2. Since the second electrodes 220_7 extend in the second direction DR2, light-emitting elements 300 disposed on the second electrodes 220_7 may all be disposed in a first area AA1. For example, there exists no second light-emitting element 302, and in a second area AA2, only third light-emitting elements 303 which are disposed on the first electrodes 210_7 may be located. The display device 10_7 of FIG. 14 is almost the same as described above with reference to FIGS. 3, 12, and 13, and thus, a further detailed description thereof will be omitted.

In some embodiments, the display device 10 of FIG. 3 may further include an additional inner bank which is disposed in the second area AA2. The additional bank may serve as a reflective barrier wall capable of reflecting light emitted from the second light-emitting element 302 and the third light-emitting elements 303 toward above the via layer 200.

Figure 15:
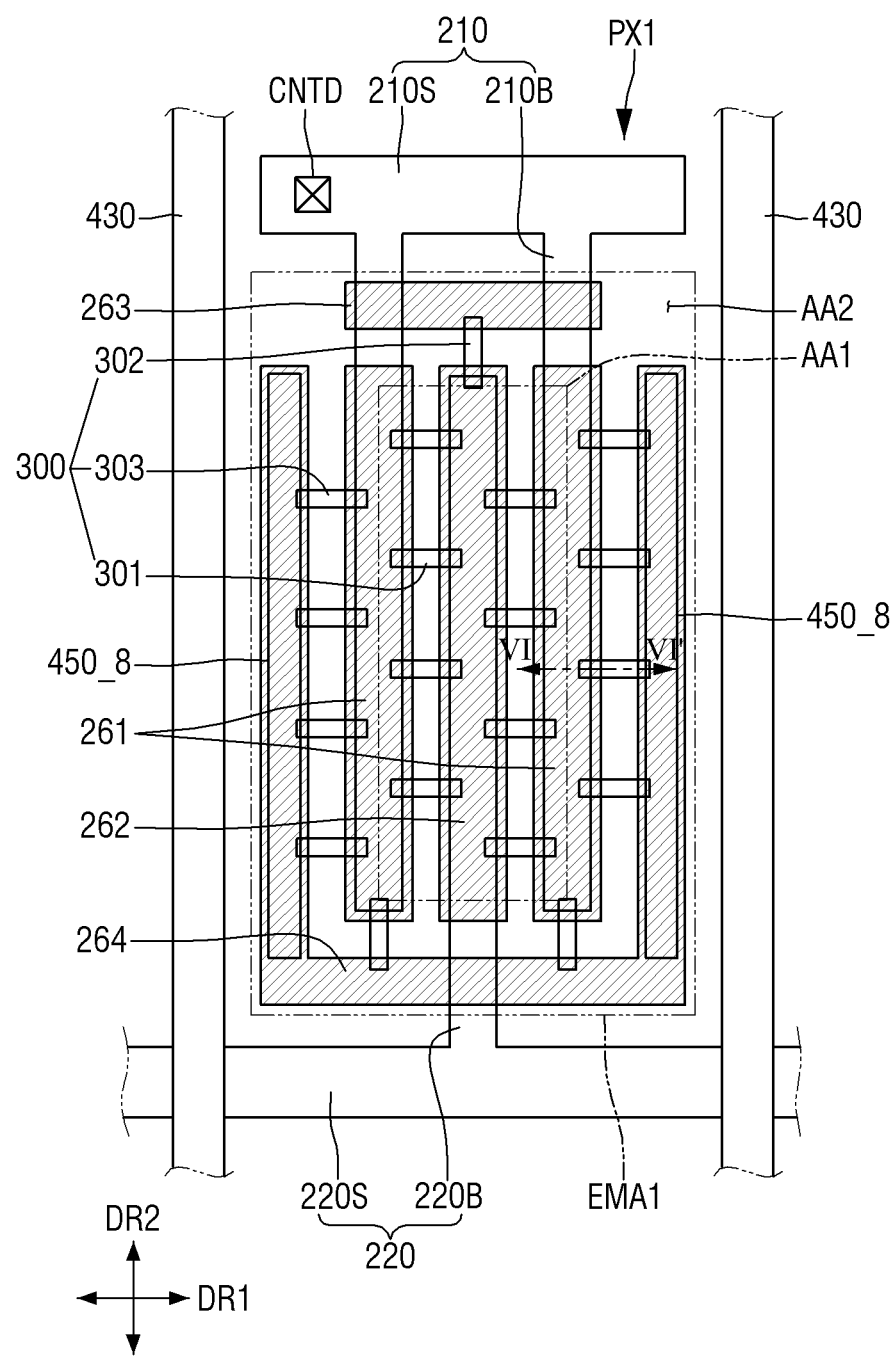
FIG. 15 is a plan view illustrating a sub-pixel of a display device according to another embodiment.
Figure 16:
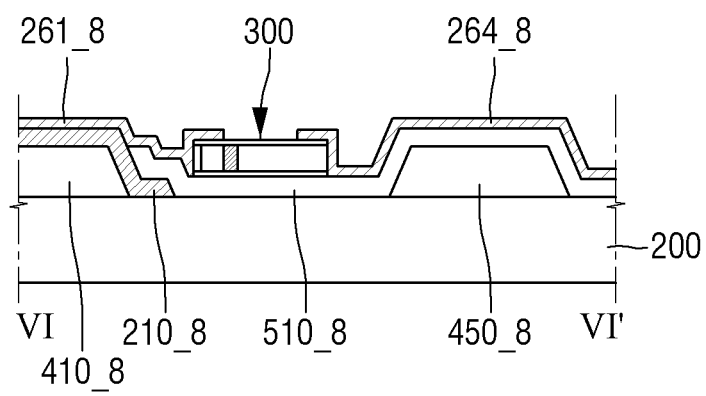
FIG. 16 is a schematic cross-sectional view taken along line VI-VI' of FIG. 15.

FIG. 15 is a plan view illustrating a sub-pixel of a display device according to another embodiment of the disclosure. FIG. 16 is a schematic cross-sectional view taken along line VI-VI' of FIG. 15.

Referring to FIGS. 15 and 16, a display device 10_8 may further include, in a first subpixel PX1, a third inner bank 450_8. At least some of a second light-emitting element 302 and third light-emitting elements 303 which are disposed in a second area AA2 may be disposed between first inner banks 410 (of FIG. 4) and the third inner bank 450_8. The display device 10_8 of FIGS. 15 and 16 differs from the display device 10 of FIG. 3 in that the third inner bank 450_8 is further provided. The display device 10_8 of FIGS. 15 and 16 will hereinafter be described, focusing mainly on the differences with the display device 10 of FIG. 3.

The third inner bank 450_8 may have substantially the same shape as the first inner banks 410 and second inner banks 420 (of FIG. 4). The third inner bank 450_8 may extend in the second direction DR2 in the first subpixel PX1 and may be spaced apart from other inner banks, i.e., the first inner banks 410 and the second inner banks 420, in the first direction DR1. The third inner bank 450_8 may be spaced apart from different first inner banks 410 in the first direction DR1 and may be disposed between the first inner banks 410 and the outer banks 430, but the disclosure is not limited thereto. For example, in case that only one inner bank 410 is provided, as illustrated in FIG. 11, the third inner bank 450_8 may be spaced apart from a second inner bank 420 in the first direction DR1 and may be disposed between the second inner bank 420 and the outer banks 430.

A third contact electrode 263_8 or a fourth contact electrode 264_8, instead of a first or second electrode 210 or 220, may be disposed on the third inner bank 450_8. A second portion of the fourth contact electrode 264_8 that extends in the second direction DR2 may be disposed on the third inner bank 450_8.

The first light-emitting elements 301 may be disposed in a first area AA1 between the first inner banks 410 and the second inner banks 420. Light emitted from ends of each of the first light-emitting elements 301 may be reflected from the inclined side surfaces of each of the first inner banks 410 and of the second inner banks 420. At least some of the second light-emitting element 302 and the third light-emitting elements 303, which are disposed in the second area AA2, may be disposed between the third inner bank 450_8 and the first inner banks 410 (or the second inner banks 420). Light emitted from ends of each of the second light-emitting element 302 and the third light-emitting elements 303 may be reflected from the inclined sides of the third inner bank 450_8 toward above the via layer 200. Accordingly, the amount of light emitted upwardly from each subpixel PXn can be increased.

The structure of a light-emitting element 300 is not limited to that illustrated in FIG. 7, but may vary.

Figure 17:
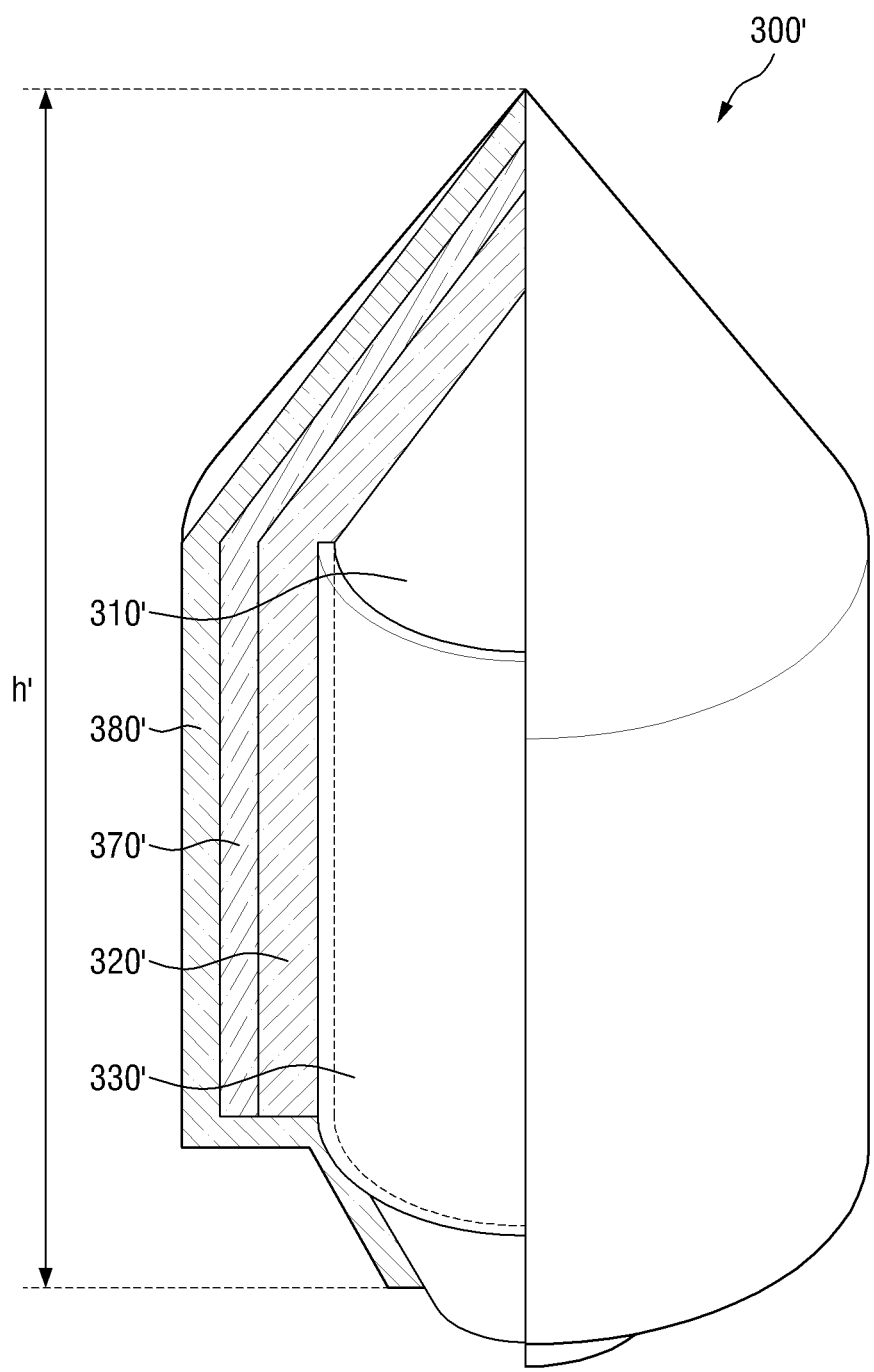
FIG. 17 is a schematic perspective view illustrating a light-emitting element according to another embodiment.

FIG. 17 is a schematic perspective view illustrating a light-emitting element according to another embodiment of the disclosure.

Referring to FIG. 17, a light-emitting element 300' may extend in one direction and may be inclined at ends thereof. For example, parts of the light-emitting element 300' may have a conical shape.

In the light-emitting element 300', at least some of the layers may be formed to surround one another, rather than to be stacked in one direction. Specifically, in the light-emitting element 300', a plurality of semiconductor layers may be formed to at least partially surround one another. The light-emitting element 300' may include a semiconductor core which extends, at least in part, in one direction and an insulating layer 380' which is formed to surround the semiconductor core. The semiconductor core may include a first semiconductor layer 310', an active layer 330', a second semiconductor layer 320', and an electrode layer 370'. The light-emitting element 300' of FIG. 17 is the same as the light-emitting element 300 of FIG. 7 except for the shapes of the first semiconductor layer 310', the active layer 330', the second semiconductor layer 320', and the electrode layer 370'. The light-emitting element 300' of FIG. 17 will hereinafter be described, focusing mainly on the differences with the light-emitting element 300 of FIG. 7.

The first semiconductor layer 310' may extend in one direction and may be inclined at ends thereof toward the center of the light-emitting element 300'. The first semiconductor layer 310' may include a rod-shaped or cylindrical main body portion and upper and lower end parts that are disposed at the upper and lower ends, respectively, of the main body portion and are inclined from the main body part. The upper end portion may be steeper than the lower end part.

The active layer 330' is disposed to surround the outer surface of the main body portion of the first semiconductor layer 310'. The active layer 330' may have a ring shape that extends in one direction. The active layer 330' may not be formed on the upper and lower end parts of the first semiconductor layer 310'. The active layer 330' may be formed only on portion of the side of the first semiconductor layer 310' that is not inclined, but the disclosure is not limited thereto. Accordingly, light can be emitted from the active layer 330' not only in the directions of ends of the light-emitting element 300', but also in the directions of sides of the light-emitting element 300'. The active layer 330' of the light-emitting element 300' of FIG. 17 has a larger area than the active layer 330 of the light-emitting element 300 of FIG. 7 and can thus emit a larger amount of light than the active layer 330 of the light-emitting element 300 of FIG. 7.

The second semiconductor layer 320' may be disposed to surround the outer surface of the active layer 330' and the upper end portion of the first semiconductor layer 310'. The second semiconductor layer 320' may include a ring-shaped main body portion that extends in one direction and an upper end portion that is inclined from the main body part. For example, the second semiconductor layer 320' may be in direct contact with the parallel sides of the active layer 330' and with the upper end portion of the first semiconductor layer 310' that is inclined, but may not be formed at the lower end of the first semiconductor layer 310'.

The electrode layer 370' may be disposed to surround the outer surface of the second semiconductor layer 320'. For example, the shape of the electrode layer 370' may be substantially the same as the shape of the second semiconductor layer 320'. In other words, the electrode layer 370' may be electrically connected with the entire outer surface of the second semiconductor layer 320'.

The insulating layer 380' may be disposed to surround the outer surfaces of the electrode layer 370' and the first semiconductor layer 310'. The insulating layer 380' includes the electrode layer 370' and may thus be in direct contact with the lower end portion of the first semiconductor layer 310' that may be inclined and with lower ends of the active layer 330' and the second semiconductor layer 320' that may be exposed.

In concluding the detailed description, those skilled in the art will appreciate that many variations and modifications can be made to the preferred embodiments without substantially departing from the principles of the invention. Therefore, the disclosed preferred embodiments of the invention are used in a generic and descriptive sense only and not for purposes of limitation.

What is claimed is:

1. A display device comprising:
   a first electrode that includes one or more first electrode branches, each first electrode branch extending in a first direction;
   a second electrode that includes one or more second electrode branches, each second electrode branch extending in the first direction and spaced apart from each of the one or more first electrode branches of the electrode in a second direction;
   a first light-emitting element disposed in a first area, the first area being defined as an entire region located directly between each of the one or more first electrode branches and each of the one or more second electrode branches;
   a second light-emitting element disposed in a second area outside of the first area;
   a first contact electrode disposed on the first electrode and electrically connected with a first end of the first light-emitting element;
   a second contact electrode disposed on the second electrode and electrically connected with a second end of the first light-emitting element and a first end of the second light-emitting element; and
   a third contact electrode disposed on the first electrode and electrically connected with a second end of the second light-emitting element, wherein the second end of the second light-emitting element does not overlap the first electrode.

2. The display device of claim 1, wherein the first light-emitting element and the second light-emitting element are electrically connected to the first electrode and the second electrode.

3. The display device of claim 2, wherein the first contact electrode and the third contact electrode are electrically connected with the first electrode and partially overlap the first electrode in a plan view.

4. The display device of claim 2, wherein the third contact electrode is electrically connected to the first contact electrode, and is not electrically connected with the first electrode.

5. The display device of claim 1, further comprising:
a third light-emitting element disposed in the second area and including a first end electrically connected with the first contact electrode; and
a fourth contact electrode disposed on the second electrode and electrically connected with a second end of the third light-emitting element.

6. The display device of claim 5, wherein
the first contact electrode and the second contact electrode extend in the first direction, and
each of the third contact electrode and the fourth contact electrode includes a first portion that extends in the second direction.

7. The display device of claim 6, wherein the first light-emitting element extends in a direction substantially parallel to the second direction.

8. The display device of claim 6, wherein each of the third contact electrode and the fourth contact electrode includes a second portion that extends in the first direction.

9. The display device of claim 8, wherein
the second light-emitting element extends in a direction substantially parallel to the first direction, the second end of the second light-emitting element being electrically connected with the first portion of the third contact electrode, and
the third light emitting element extends in a direction substantially parallel to the second direction, the second end of the third light-emitting element being electrically connected with the second portion of the fourth contact electrode.

10. The display device of claim 5, further comprising:
an insulating layer disposed in the first area between the first electrode and the second electrode and disposed on at least a portion of the first light-emitting element.

11. The display device of claim 10, wherein the insulating layer extends in the first direction and is not electrically connected with the second and third light-emitting elements.

12. The display device of claim 1, wherein the second area includes all areas between a distil end of each second electrode and the third contact electrode.

13. The display device of claim 1, wherein the first area is directly between a centerline in a length direction of each of the one or more first electrode and a centerline in a length direction of each of the one or more second electrode.

14. A display device comprising:
a first electrode including:
a first electrode stem extending in a first direction; and
a first electrode branch branched off from the first electrode stem and extending in a second direction;
a second electrode including:
a second electrode stem extending in the first direction; and
a second electrode branch branched off from the second electrode stem and spaced apart from the first electrode branch;
a first light-emitting element disposed between a first side of the first electrode branch and a first side of the second electrode branch;
a second light-emitting element disposed on a second side of the first electrode branch;
a third light-emitting element disposed on a second side of the second electrode branch;
a first contact electrode disposed on the first electrode branch and electrically connected with a first end of the first light-emitting element and a first end of the second light-emitting element;
a second contact electrode disposed on the second electrode branch and electrically connected with a second end of the first light-emitting element and a first end of the third light-emitting element;
a third contact electrode electrically connected with a second end of the second light-emitting element; and
a fourth contact electrode electrically connected with a second end of the third light-emitting element, wherein
the second end of at least one of the light-emitting element and second light-emitting element does not overlap an electrode branch.

15. The display device of claim 14, wherein the first, second, and third light-emitting elements are electrically connected to the first and second electrodes.

16. The display device of claim 15, wherein
the first contact electrode is electrically connected with the first electrode branch and partially overlaps the first electrode branch in a plan view, and
the second contact electrode is electrically connected with the second electrode branch and partially overlaps the second electrode branch in a plan view.

17. The display device of claim 16, wherein the first and second contact electrodes extend in the second direction and are spaced apart from each other in the first direction.

18. The display device of claim 17, wherein
each of the third and fourth contact electrodes includes a portion that extends in the first direction,
the third contact electrode is electrically connected with the second electrode branch, and
the fourth contact electrode is electrically connected with the first electrode branch.

19. The display device of claim 17, wherein
each of the third and fourth contact electrodes includes a portion that extends in the second direction,
the third contact electrode is electrically connected with the second electrode stem, and
the fourth contact electrode is electrically connected with the first electrode stem.

20. The display device of claim 14, wherein at least one of the second light-emitting element and the third light-emitting element is not disposed between an electrode branch of the first electrode and an electrode branch of the second electrode.

21. A display device comprising:
a first electrode and a second electrode spaced apart from each other on a substrate;
a first insulating layer disposed on the substrate and at least partially overlapping the first and second electrodes in a plan view;
at least one light-emitting element disposed on the first insulating layer and electrically connected to the first electrode and the second electrode, the at least one light-emitting element including:

a first light-emitting element disposed in a first area between the first electrode and the second electrode; and a second light-emitting element disposed in a second area outside of the first area; and at least one contact electrode electrically connected with an end of the at least one light-emitting element and at least one of the first electrode and the second electrode, the at least one contact electrode including:

a first contact electrode electrically connected with a first end of the first light-emitting element and a first end of the second light-emitting element;

a second contact electrode electrically connected with a second end of the first light-emitting element; and a third contact electrode electrically connected with a second end of the second light-emitting element, wherein the first electrode and the second electrode both extend lengthwise in a first direction and are spaced apart in a second direction, the first contact electrode is disposed on the first electrode and extends lengthwise in the first direction, the second contact electrode is disposed on the second electrode and extends lengthwise in the first direction, and the third contact electrode extends lengthwise in the second direction.

22. The display device of claim 21, further comprising:

a plurality of banks disposed on the substrate, the plurality of banks including:

a first inner bank below and overlapping the first electrode and the first contact electrode;

a second inner bank below and partially overlapping the second electrode and the second contact electrode, the second inner bank spaced apart from the first inner bank; and a third inner bank below and partially overlapping the third contact electrode, the third inner bank spaced apart from the first inner bank and the second inner bank.

23. The display device of claim 22, further comprising:

a second insulating layer disposed between the first electrode and the second electrode and overlapping at least a portion of the first light-emitting element, wherein the second insulating layer directly contacts the first electrode and the second contact electrode, and partially overlaps the first contact electrode and the second contact electrode in a plan view.

* * * * *